United States Patent
Kinoshita et al.

(10) Patent No.: US 9,837,496 B2
(45) Date of Patent: Dec. 5, 2017

(54) SEMICONDUCTOR DEVICE AND METHOD FOR MANUFACTURING SAME

(71) Applicant: Panasonic Intellectual Property Management Co., Ltd., Osaka (JP)

(72) Inventors: Yusuke Kinoshita, Kyoto (JP); Satoshi Tamura, Osaka (JP); Tetsuzo Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 102 days.

(21) Appl. No.: 14/930,628

(22) Filed: Nov. 2, 2015

(65) Prior Publication Data

US 2016/0056245 A1    Feb. 25, 2016

Related U.S. Application Data

(63) Continuation of application No. PCT/JP2014/002655, filed on May 21, 2014.

(30) Foreign Application Priority Data

May 24, 2013   (JP) .................................. 2013-110034

(51) Int. Cl.
*H01L 29/06*   (2006.01)
*H01L 29/205*  (2006.01)
(Continued)

(52) U.S. Cl.
CPC ........ *H01L 29/205* (2013.01); *H01L 29/1066* (2013.01); *H01L 29/432* (2013.01);
(Continued)

(58) Field of Classification Search
CPC ............... H01L 31/072; H01L 31/0328; H01L 31/0336; H01L 31/109
See application file for complete search history.

(56) References Cited

U.S. PATENT DOCUMENTS

| 2005/0189559 A1 | 9/2005 | Saito et al. |
| 2006/0138454 A1 | 6/2006 | Saito et al. |
| 2010/0258841 A1 | 10/2010 | Lidow et al. |

FOREIGN PATENT DOCUMENTS

| JP | 2005-244072 | 9/2005 |
| JP | 2007-066979 | 3/2007 |

(Continued)

OTHER PUBLICATIONS

International Search Report of PCT application No. PCT/JP2014/002655 dated Aug. 12, 2014.
(Continued)

*Primary Examiner* — Samuel Gebremariam
(74) *Attorney, Agent, or Firm* — McDermott Will & Emery LLP

(57) ABSTRACT

A semiconductor device includes: a channel layer which is made of $In_pAl_qGa_{1-p-q}N$ ($0 \le p+q \le 1$, $0 \le p$, and $0 \le q$); a barrier layer which is formed on the channel layer and is made of $In_rAl_sGa_{1-r-s}N$ ($0 \le r+s \le 1$, $0 \le r$) having a bandgap larger than that of the channel layer; a diffusion suppression layer which is selectively formed on the barrier layer and is made of $In_tAl_uGa_{1-t-u}N$ ($0 \le t+u \le 1$, $0 \le t$, and $s>u$); a p-type conductive layer which is formed on the diffusion suppression layer and is made of $In_xAl_yGa_{1-x-y}N$ ($0 \le x+y \le 1$, $0 \le x$, and $0 \le y$) having p-type conductivity; and a gate electrode which is formed on the p-type conductive layer.

18 Claims, 8 Drawing Sheets

(51) Int. Cl.

| | | |
|---|---|---|
| *H01L 29/66* | (2006.01) | |
| *H01L 29/778* | (2006.01) | |
| *H01L 29/808* | (2006.01) | |
| *H01L 29/43* | (2006.01) | |
| *H01L 29/10* | (2006.01) | |
| *H01L 29/20* | (2006.01) | |
| *H01L 29/201* | (2006.01) | |

(52) U.S. Cl.
CPC .. *H01L 29/66462* (2013.01); *H01L 29/66916* (2013.01); *H01L 29/66924* (2013.01); *H01L 29/7786* (2013.01); *H01L 29/8086* (2013.01); *H01L 29/201* (2013.01); *H01L 29/2003* (2013.01)

(56) References Cited

FOREIGN PATENT DOCUMENTS

| | | |
|---|---|---|
| JP | 2007-242746 | 9/2007 |
| JP | 2008-153330 | 7/2008 |
| JP | 2008-277655 | 11/2008 |
| JP | 2010-258313 | 11/2010 |
| JP | 2012-523700 | 10/2012 |

OTHER PUBLICATIONS

T. Kawasaki et al., "Normally-off AlGaN/GaN HEMT with Recessed Gate for High Power Applications" Solid State Devices and Materials 2005 tech. digest pp. 206-207.

M. Kuroda et al., "Normally-off Operation of Non-polar AlGan/GaN Heterojunction FETs Grown on R-plane Sapphire" Solid State Devices and Materials 2005 tech. digest pp. 470-471.

SEMICONDUCTOR DEVICE AND METHOD FOR MANUFACTURING SAME

BACKGROUND OF THE INVENTION

1. Field of the Invention

The present disclosure relates to a semiconductor device and a method for manufacturing the same.

2. Description of the Related Art

In recent years, researches for a field effect transistor (FET) using a gallium nitride (GaN)-based compound semiconductor material have been actively performed as a power device.

Since a nitride semiconductor material such as GaN can be used for manufacturing various mixed crystals such as aluminum nitride (AlN) and indium nitride (InN), heterojunction can be formed similar to an arsenic semiconductor material such as gallium arsenide (GaAs) in the related art. Particularly, in the heterojunction due to the nitride semiconductor, even in an undoped state, high concentration carriers generated by spontaneous polarization or piezoelectric polarization are generated on an interface of the heterojunction. As a result, in a case where FET is manufactured, the FET is easily formed in a depression type (normally-on type). Accordingly, it is difficult to achieve a characteristic of an enhancement type (normally-off type). However, currently, most devices available in a power electronics market are the normally-off type, and thus, the normally-off type is also strongly necessary for the GaN-based nitride semiconductor device.

As a normally-off type transistor, there is a structure in which a gate formation region is dug to shift a threshold voltage of a gate into a positive value (for example, see Non Patent Literature 1). Further, for example, there is a method in which an FET is manufactured on a (10-12) plane which is a plane orientation of a crystal plane in a substrate made of sapphire and a polarization field is prevented from being generated in a direction of crystal growth of the nitride semiconductor, to thereby realize a normally-off type (for example, see Non Patent Literature 2). Here, a negative sign "-" attached to a mirror index in the plane orientation represents inversion of one index subsequent to the negative sign, for convenience.

Further, as a desirable structure for realizing the normally-off type FET, a junction field effect transistor (JEFT) in which a p-type GaN layer is provided in a gate formation region has been proposed (for example, see Patent Literature 1).

In the JFET, piezoelectric polarization generated on a first heterointerface between a channel layer made of GaN and a barrier layer made of AlGaN is canceled by different piezoelectric polarization generated on a second heterointerface between the barrier layer made of AlGaN and a p-type GaN layer provided thereon. Thus, it is possible to selectively reduce a two-dimensional electron gas (2DEG) immediately under a gate formation region where the p-type GaN layer is formed. Accordingly, the JFET can realize a normally-off characteristic. Further, by using, in a gate electrode, pn junction having a built-in potential larger than that of Schottky contact which is contact between a metal and a semiconductor, it is possible to increase a rising voltage of a gate. Thus, even when a positive gate voltage is applied, it is possible to reduce a leakage current of the gate.

CITATION LIST

Patent Literature

PTL 1: Japanese Patent Unexamined Publication No. 2005-244072

Non Patent Literature

NPL 1: T. Kawasaki et al, Solid State Devices and Materials 2005 tech. digest pp. 206-207

NPL 2: M. Kuroda et al, Solid State Devices and Materials 2005 tech. digest pp. 470-471

SUMMARY OF THE INVENTION

FIG. 1 and FIG. 2 are sectional views of test materials of different JFETs in a process flow.

The JFETs shown in FIGS. 1 and 2 include GaN layer 901, AlGaN barrier layer 902 formed on GaN layer 901, source electrode 903 and drain electrode 904 made of Ti/Al formed on AlGaN barrier layer 902 (hereinafter, may be referred to as Ti/Al electrodes).

Here, the above-mentioned AlGaN represents $Al_uGa_{1-u}N$ (u is an arbitrary value of $0 \leq u \leq 1$) which is a ternary-mixed crystal. Hereinafter, a multinary-mixed crystal may be simply indicated by an arrangement of the symbols of elements thereof, for example, InAlGaN, GaN, or the like. For example, $In_xAl_yGa_{1-x-y}N$ (x and y are arbitrary values of $0 \leq x \leq 1$ and $0 \leq y \leq 1$)) which is a nitride semiconductor may be simply represented as InAlGaN.

The JFET shown in FIG. 1 is manufactured by forming a Ti/Al electrode on an AlGaN/GaN epitaxial growth layer. On the other hand, the JFET shown in FIG. 2 is manufactured by selectively removing only p-type GaN layer 905 by dry etching with respect to a p-type GaN/AlGaN/GaN epitaxial growth layer, and then, forming a Ti/Al electrode. That is, FIG. 1 is a sectional view illustrating a process flow of a JFET for which dry etching is not used, and FIG. 2 is a sectional view illustrating a process flow of a JFET for which dry etching is used. Final structures in both cases are the same.

FIG. 3 is a graph illustrating a contact resistivity of each of two types of test materials shown in FIG. 1 and FIG. 2. As shown in FIG. 3, contact resistance of a test material in which p-type GaN layer 905 is grown (test material for which dry etching is performed) is larger than contact resistance of a test material in which p-type GaN layer 905 is not grown (test material for which dry etching is not performed).

It is understood that Mg which is a p-type dopant is present in AlGaN barrier layer 902, from an analysis result based on a secondary ion mass spectrometry (SIMS) method with respect to the test material shown in FIG. 2. It is considered that detection of Mg even when doping of Mg into AlGaN barrier layer 902 is not performed means that Mg is diffused to AlGaN barrier layer 902 during growth of p-type GaN layer 905. Normally, since a growth temperature of a GaN-based nitride semiconductor is equal to or higher than 1000° C., it is difficult to prevent the diffusion of Mg.

AlGaN barrier layer 902 including Mg is changed into a p-type, which causes increase in contact resistance and sheet resistance. An Al-based material such as Ti/Al which is widely used in source electrode 903 and drain electrode 904 is a metallic material with a small work function for an n-type GaN-based nitride semiconductor. Thus, when AlGaN barrier layer 902 is changed into the p-type, the contact resistance increases. Further, when AlGaN barrier layer 902 is changed into the p-type, since a carrier density of a two-dimensional electron gas is reduced compared with an i-type (intrinsic type) or an n-type, the sheet resistance increases.

As described above, when p-type GaN layer 905 is grown in order to manufacture a JFET type device, diffusion of a p-type dopant doped in p-type GaN layer 905 may cause deterioration of performance of the device.

In order to solve the above problems, an object of the present disclosure is to provide a semiconductor device and a method for manufacturing the same capable of reducing contact resistance and sheet resistance.

According to an aspect of the present disclosure, there is provided a semiconductor device including: a first semiconductor layer which is made of $In_pAl_qGa_{1-p-q}N$ ($0 \leq p+q \leq 1$, $0 \leq p$, and $0 \leq q$); a second semiconductor layer which is formed on the first semiconductor layer, and is made of $In_rAl_sGa_{1-r-s}N$ ($0 \leq r+s \leq 1$, $0 \leq r$) having a bandgap larger than that of the first semiconductor layer; a third semiconductor layer which is selectively formed on the second semiconductor layer, and is made of $In_tAl_uGa_{1-t-u}N$ ($0 \leq t+u \leq 1$, $0 \leq t$, and $s > u$); a fourth semiconductor layer which is formed on the third semiconductor layer, and is made of $In_xAl_yGa_{1-x-y}N$ ($0 \leq x+y \leq 1$, $0 \leq x$, and $0 \leq y$) having p-type conductivity; and a gate electrode which is formed on the fourth semiconductor layer.

According to this configuration, since the third semiconductor layer is present between the second semiconductor layer which is a barrier layer of the semiconductor device and the fourth semiconductor layer having the p-type conductivity, even when a p-type dopant is diffused during growth of the fourth semiconductor layer, it is possible to reduce the amount of the p-type dopant diffused to the second semiconductor layer. Thus, it is possible to suppress the change of the second semiconductor layer into the p-type, and to suppress deterioration of contact resistance and sheet resistance.

According to another aspect of the present disclosure, there is provided a method for manufacturing a semiconductor device, including the steps of: forming a first semiconductor layer made of $In_pAl_qGa_{1-p-q}N$ ($0 \leq p+q \leq 1$, $0 \leq p$, and $0 \leq q$); forming a second semiconductor layer made of $In_rAl_sGa_{1-r-s}N$ ($0 \leq r+s \leq 1$, $0 \leq r$) having a bandgap larger than that of the first semiconductor layer, on the first semiconductor layer; forming a third semiconductor layer made of $In_tAl_uGa_{1-t-u}N$ ($0 \leq t+u \leq 1$, $0 \leq t$, and $s > u$) on the second semiconductor layer; forming a fourth semiconductor layer made of $In_xAl_yGa_{1-x-y}N$ ($0 \leq x+y \leq 1$, $0 \leq x$, and $0 \leq y$) having p-type conductivity on the third semiconductor layer; forming a gate electrode on the fourth semiconductor layer; and removing a region other than a region corresponding to the gate electrode, in the third semiconductor layer and the fourth semiconductor layer, after forming the fourth semiconductor layer.

According to this method, it is possible to manufacture a semiconductor device capable of reducing contact resistance and sheet resistance.

According to the semiconductor device of the present disclosure, it is possible to reduce contact resistance and sheet resistance.

DETAILED DESCRIPTION OF THE PREFERRED EMBODIMENTS

Hereinafter, exemplary embodiments of the present disclosure will be described with reference to the accompanying drawings. Here, detailed description may be omitted. For example, detailed description for components which are known in the related art or repetitive description for substantially the same configuration may be omitted. This is made for prevention of unnecessary repetition in the following description and for ease of understanding of those skilled in the art.

The accompanying drawings and the following description are provided so that those skilled in the art can sufficiently understand the present disclosure, and are not intended to limit the subject matter of claims.

All embodiments described below show specific examples of the present disclosure. Numerical values, shapes, materials, components, arrangement positions of the components, steps, the order of the steps, or the like shown in the following embodiments are examples, and do not limit the present disclosure. Further, components which are not disclosed in independent claims indicating concepts having the widest meaning, among components in the following embodiments, will be described as arbitrary components.

First Exemplary Embodiment

Hereinafter, a semiconductor device according to a first exemplary embodiment will be described with reference to FIG. 4 and FIG. 5.

<Configuration>

Figure 1:
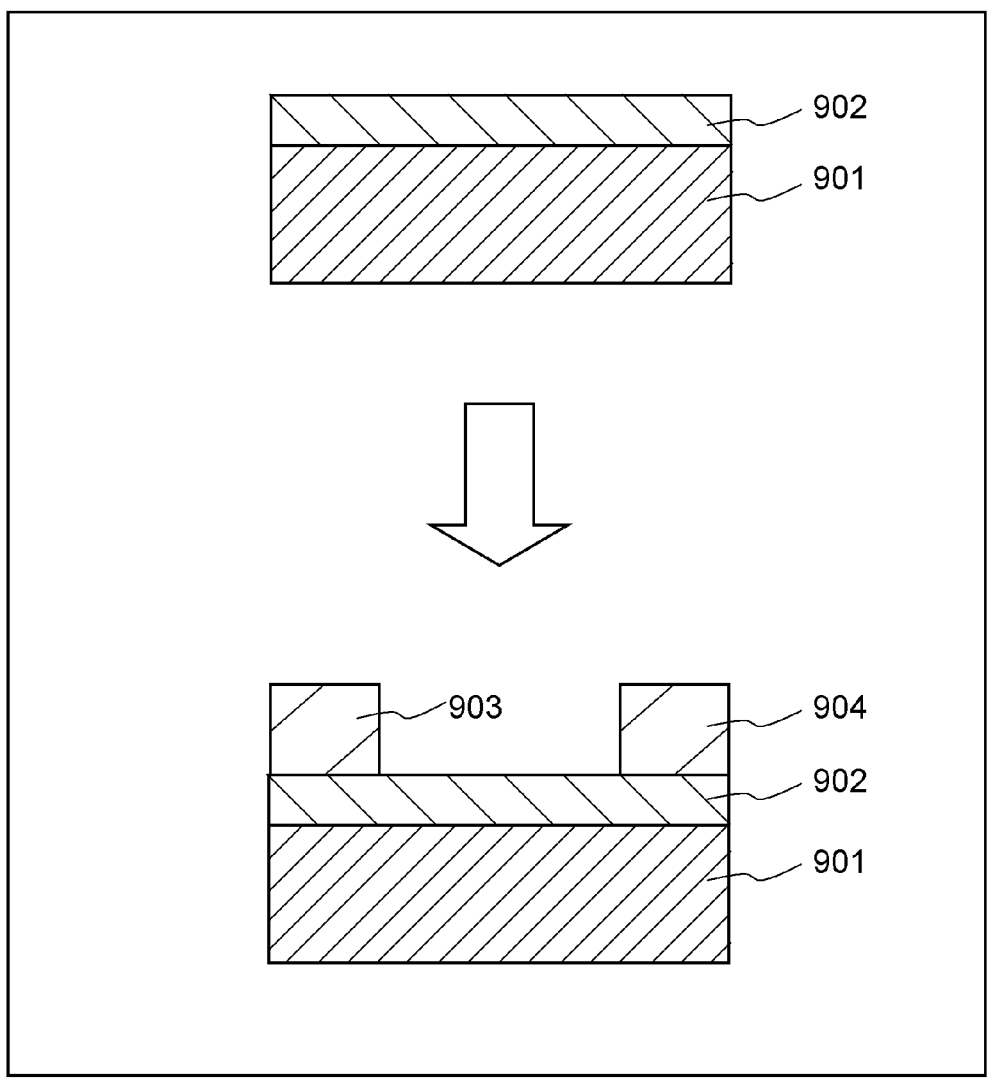
FIG. 1 is a sectional view illustrating a process flow of JFET where dry etching is not used.
Figure 2:
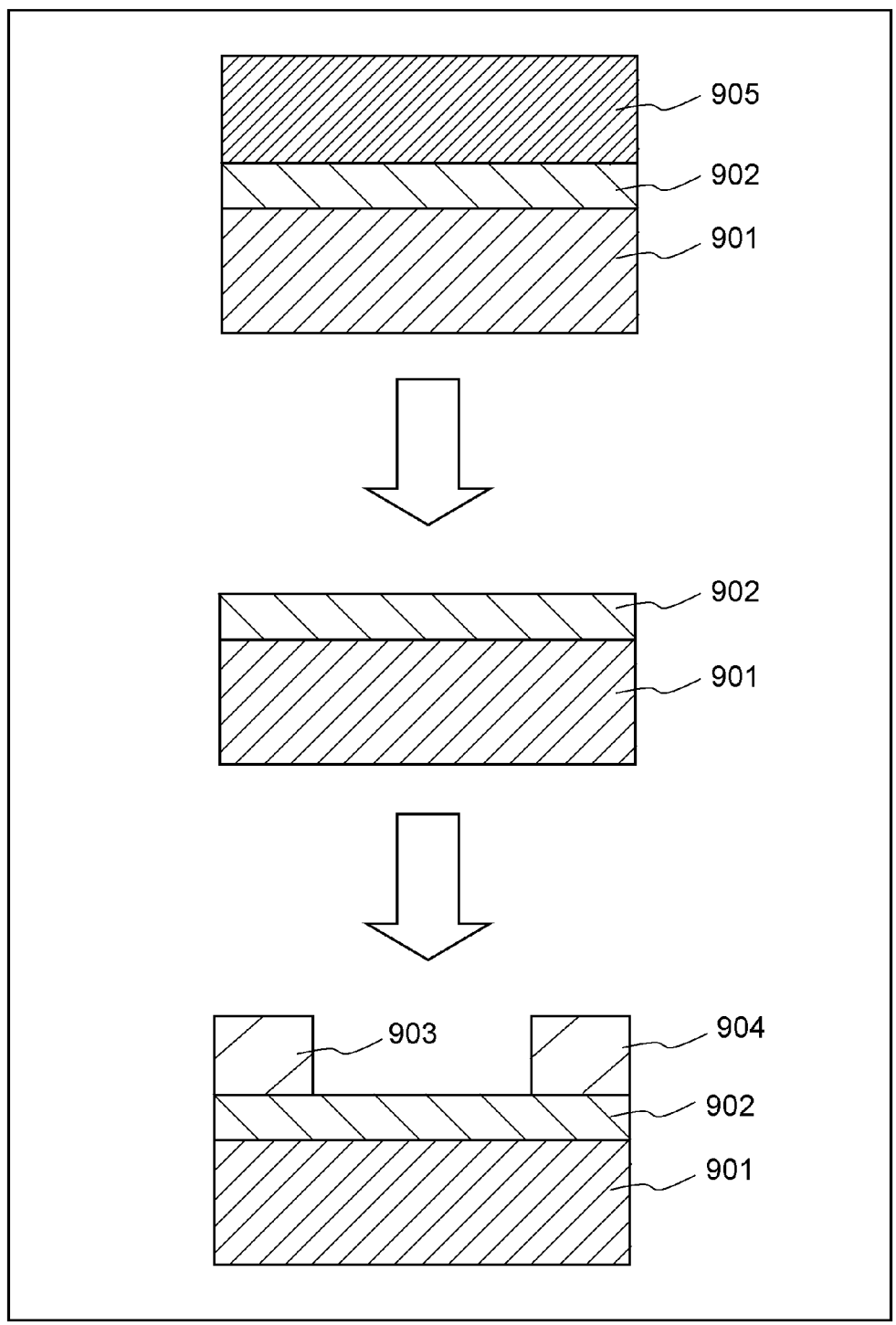
FIG. 2 is a sectional view illustrating a process flow of JFET where dry etching is used.
Figure 3:
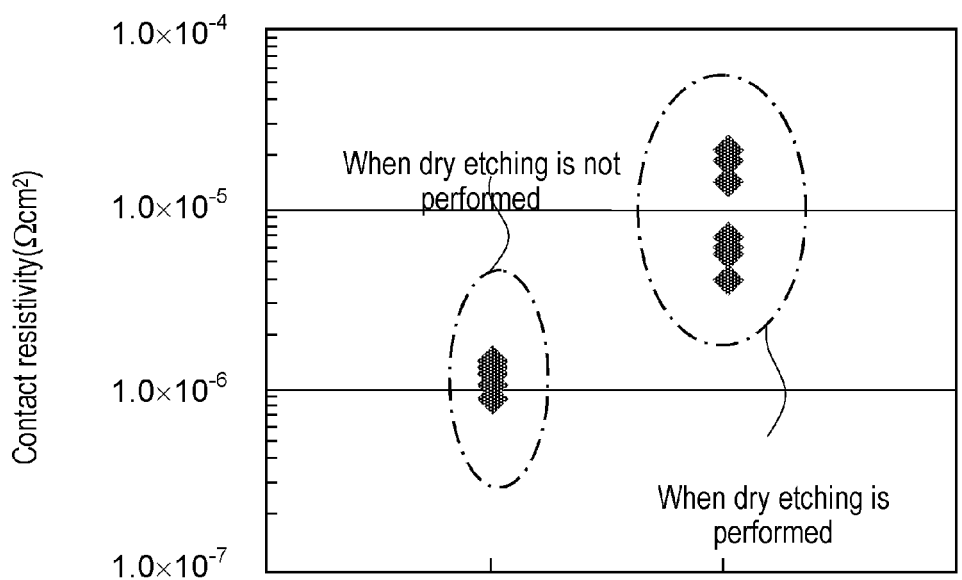
FIG. 3 is a graph illustrating a contact resistivity of each of two types of samples shown in FIG. 1 and FIG. 2.
Figure 4:
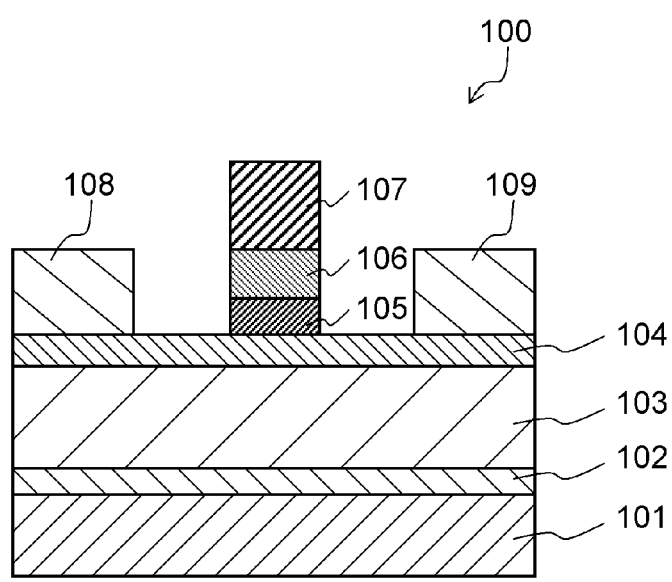
FIG. 4 is a sectional view illustrating a configuration of a nitride semiconductor device according to a first exemplary embodiment.
Figure 5:
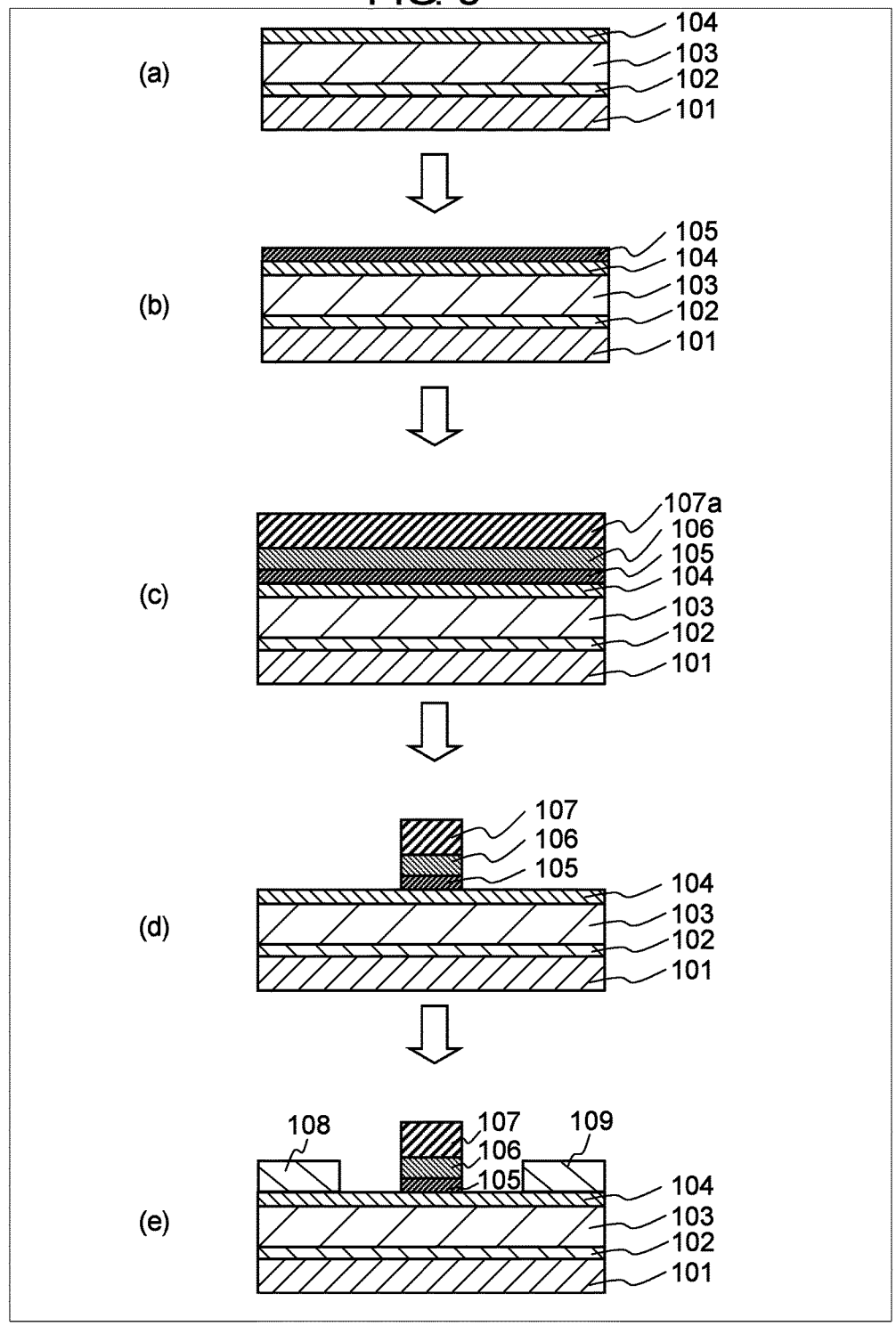
FIG. 5 is diagram illustrating a manufacturing process of the nitride semiconductor device according to the first exemplary embodiment.

FIG. 4 is a sectional view illustrating a configuration of nitride semiconductor device 100 according to the first exemplary embodiment of the present disclosure. Nitride semiconductor device 100 is an example of a semiconductor device in the present disclosure, and is a field effect transistor, for example.

Nitride semiconductor device 100 includes Si substrate 101 where a (111) plane is a main plane, for example, buffer layer 102 made of AlN provided on the (111) plane of Si substrate 101, channel layer 103 represented as $In_pAl_qGa_{1-p-q}N$ (p=0.05 and q=0.02) provided on buffer layer 102, barrier layer 104 represented as $In_rAl_sGa_{1-r-s}N$ (r=0.09 and s=0.32) provided on channel layer 103, diffusion suppression layer 105 represented as $In_tAl_uGa_{1-t-u}N$ (t=0.05 and u=0.05) which is partially provided on barrier layer 104, and p-type conductive layer 106 represented as $In_xAl_yGa_{1-x-y}N$ (x=0.05 and y=0.05) having p-type conductivity, provided on diffusion suppression layer 105.

Here, barrier layer 104 has a bandgap greater than that of channel layer 103. Thus, in nitride semiconductor device 100, a two-dimensional electron gas is generated on an interface between barrier layer 104 and channel layer 103. In this configuration, it is possible to change a bandgap and a lattice constant of a second semiconductor layer by changing a combination of respective compositions of In and Al of barrier layer 104. However, it is necessary that the bandgap of barrier layer 104 is greater than the bandgap of channel layer 103 so that electrons are accumulated on the interface between channel layer 103 and barrier layer 104.

Channel layer 103, barrier layer 104, diffusion suppression layer 105, and p-type conductive layer 106 sequentially correspond to examples of a first semiconductor layer, a second semiconductor layer, a third semiconductor layer, and a fourth semiconductor layer.

For example, a film thickness of buffer layer 102 is 100 nm, a film thickness of channel layer 103 is 2 μm, a film thickness of barrier layer 104 is 30 nm, a film thickness of diffusion suppression layer 105 is 25 nm, and a film thickness of p-type conductive layer 106 is 200 nm.

Gate electrode 107 made of nickel (Ni) is formed on p-type conductive layer 106.

Source electrode 108 and drain electrode 109 which are respectively made of titanium (Ti)/aluminum (Al) are formed on both sides of gate electrode 107 so as to be in contact with barrier layer 104.

For example, Mg of $5\times10^{19}/cm^3$ is doped in p-type conductive layer 106. That is, Mg is a p-type dopant in p-type conductive layer 106.

Diffusion suppression layer 105 suppresses diffusion of Mg to barrier layer 104 from p-type conductive layer 106. Mg diffused from p-type conductive layer 106 is included in diffusion suppression layer 105. Thus, a variation of Mg concentration per unit length in a film thickness direction is greater in diffusion suppression layer 105 compared with p-type conductive layer 106. An Mg concentration of diffusion suppression layer 105 is equal to or smaller than $1\times10^{19}/cm^3$ in a portion that is in contact with barrier layer 104. Barrier layer 104 has an Mg concentration which is equal to or smaller than $1\times10^{19}/cm^3$ in a portion that is in contact with diffusion suppression layer 105. Thus, it is possible to suppress change of barrier layer 104 into a p-type. As a result, it is possible to reduce sheet resistance, to achieve ohmic contact between source electrode 108 and drain electrode 109, and to obtain small on-resistance.

Here, the film thickness of diffusion suppression layer 105 may be set so that the Mg concentration in the portion that is in contact with barrier layer 104 is equal to or smaller than $1\times10^{19}/cm^3$.

As described above, nitride semiconductor device 100 according to this exemplary embodiment includes diffusion suppression layer 105 formed between barrier layer 104 and p-type conductive layer 106. With such a configuration, even though Mg which is the p-type dopant is diffused from p-type conductive layer 106 during growth of p-type conductive layer 106, it is possible to reduce the amount of Mg which is diffused to barrier layer 104. Accordingly, it is possible to suppress change of barrier layer 104 into the p-type, and thus, it is possible to suppress deterioration of contact resistance and sheet resistance.

Specifically, by suppressing change of barrier layer 104 into the p-type, it is possible to suppress reduction in a carrier density of the two-dimensional electron gas generated on the interface between channel layer 103 and barrier layer 104, and thus, it is possible to suppress increase in the sheet resistance.

Further, by suppressing change of barrier layer 104 into the p-type, it is possible to suppress increase in contact resistance of source electrode 108 and drain electrode 109 made of an Al-based material. More specifically, the Al-based material such as Ti/Al that forms source electrode 108 and drain electrode 109 is a metallic material with a small work function for an n-type GaN-based nitride semiconductor. Thus, if barrier layer 104 is changed into the p-type, the contact resistance increases. In this regard, in this exemplary embodiment, since it is possible to suppress change of barrier layer 104 into the p-type by providing diffusion suppression layer 105, it is possible to suppress increase in the contact resistance.

Further, nitride semiconductor device 100 according to this exemplary embodiment includes channel layer 103 represented as $In_pAl_qGa_{1-p-q}N$ (p=0.05 and q=0.02). Since In is included in channel layer 103 in this way, it is possible to increase carrier mobility of the two-dimensional electron gas generated on the interface between channel layer 103 and barrier layer 104. Further, since Al is included in channel layer 103, it is possible to increase a dielectric breakdown voltage. As the composition of Al included in channel layer 103 is greater, the dielectric breakdown voltage increases. Here, at least one of In and Al doesn't have to be included in channel layer 103.

Further, in this exemplary embodiment, the p-type dopant of p-type conductive layer 106 is Mg. Further, barrier layer 104 has an Mg concentration which is equal to or smaller than $1\times10^{19}/cm^3$ in the portion that is in contact with diffusion suppression layer 105, and diffusion suppression layer 105 has an Mg concentration which is equal to or smaller than $1\times10^{19}/cm^3$ in the portion that is in contact with barrier layer 104.

According to this configuration, barrier layer 104 that is in contact with source electrode 108 and drain electrode 109 is not changed into the p-type. Thus, it is possible to suppress deterioration of contact resistance and sheet resistance. Specifically, in a nitride gallium system, Mg or Zn is selected as the p-type dopant, but it is known that its activation rate is low due to a deep impurity level thereof. In addition, in crystal growth based on an MOCVD method used in crystal growth of the nitride gallium system, hydrogen atoms generated by decomposition of hydrogen or the like used in a carrier gas are combined with magnesium to form Mg—H and to inactivate Mg. The hydrogen can be removed to some extent by performing a high temperature annealing process at a temperature of about 800° C. under in vacuum or an inertial gas atmosphere after crystal growth, but normally, the hydrogen remains with a high concentration of $1\times10^{18}/\text{cm}^3$ to $1\times10^{19}/\text{cm}^3$. The activation rate of Mg in the nitride is generally estimated to be about 10%, and thus, the high-concentration hydrogen is present in each semiconductor layer. In consideration of this fact, it can be said that if the concentration of Mg is equal to or smaller than $1\times10^{19}/\text{cm}^3$, barrier layer 104 is not easily changed into the p-type, and if the concentration of Mg is equal to or smaller than $\times10^{18}/\text{cm}^3$, barrier layer 104 is not changed into the p-type.

Accordingly, since barrier layer 104 has the Mg concentration which is equal to or smaller than $1\times10^{18}/\text{cm}^3$ in the portion that is in contact with diffusion suppression layer 105, barrier layer 104 that is in contact with source electrode 108 and drain electrode 109 is not changed into the p-type. Thus, it is possible to suppress deterioration of contact resistance and sheet resistance.

Diffusion of Mg from p-type conductive layer 106 which is a p-type semiconductor layer continuously occurs. Thus, when the Mg concentration of barrier layer 104 is equal to or smaller than $1\times10^{19}/\text{cm}^3$, the Mg concentration in the portion of diffusion suppression layer 105 that is in contact with barrier layer 104 becomes equal to or smaller than $1\times10^{19}/\text{cm}^3$. Here, if the Al concentration in barrier layer 104 is high, Mg is not easily diffused and is easily accumulated, and thus, the Mg concentration in a region other than the portion of barrier layer 104 that is in contact with diffusion suppression layer 105 may increase.

Further, the Mg concentration on a side of diffusion suppression layer 105 being in contact with p-type conductive layer 106 outside a gate electrode formation region which is a region where gate electrode 107 is formed is arbitrary. That is, in the manufacturing process of nitride semiconductor device 100, for example, the Mg concentration of diffusion suppression layer 105 in a range removed by plasma dry etching, for example, is arbitrary.

<Manufacturing Method>

Next, a manufacturing method of the nitride semiconductor device according to this exemplary embodiment will be described. In FIG. 5, (a) to (e) are diagrams illustrating a manufacturing process of nitride semiconductor device 100 according to this exemplary embodiment. In the following, (a) to (f) in FIG. 5 are denoted FIG. 5(a) to FIG. 5(e), respectively.

First, buffer layer 102, channel layer 103, and barrier layer 104 are sequentially formed on Si substrate 101 by an MOCVD method. Thus, as shown in FIG. 5(a), Si substrate 101, buffer layer 102, channel layer 103, and barrier layer 104 are formed. With this stacked structure, a two-dimensional electron gas is generated on an interface between channel layer 103 and barrier layer 104.

Then, as shown in FIG. 5(b), diffusion suppression layer 105 is formed by an MOCVD method, and as shown in FIG. 5(c), p-type conductive layer 106 is formed by an MOCVD method. Then, gate electrode layer 107a made of Ni is formed using a vacuum deposition method or a sputtering method.

Then, as shown in FIG. 5(d), gate electrode layer 107a outside the gate electrode formation region is removed by a plasma dry etching method using plasma based on an Ar-based gas, for example. Subsequently, diffusion suppression layer 105 and p-type conductive layer 106 are removed by a plasma dry etching method using plasma based on a gas obtained by adding oxygen to an F-based gas or a Cl-based gas.

Here, the relationship between the composition of Al in barrier layer 104 represented as $In_rAl_sGa_{1-r-s}N$ (r=0.09 and s=0.32) and the composition of Al in diffusion suppression layer 105 represented as $In_tAl_uGa_{1-t-u}N$ (t=0.05 and u=0.05) satisfies s>u. In this way, since the composition of Al in barrier layer 104 is higher than the composition of Al in diffusion suppression layer 105, in the plasma dry etching where oxygen is added to an F-base gas or a Cl-base gas, an etching rate of barrier layer 104 is slower than an etching rate of diffusion suppression layer 105. Thus, it is possible to selectively remove diffusion suppression layer 105. As a result, it is possible to suppress an etching amount of barrier layer 104, and to suppress reduction in the concentration of the two-dimensional electron gas generated on the interface between barrier layer 104 and channel layer 103.

Next, as shown in FIG. 5(e), source electrode 108 and drain electrode 109 made of Ti/Al are formed on barrier layer 104 using a vacuum deposition method or a sputtering method.

Nitride semiconductor device 100 is manufactured through the above-described processes. In the manufacturing process, gate electrode 107 is formed by removing gate electrode layer 107a outside the gate electrode formation region, but the manufacturing method of nitride semiconductor device 100 is not limited thereto. For example, after the process where p-type conductive layer 106 is formed by the MOCVD method, diffusion suppression layer 105 and p-type conductive layer 106 outside the gate electrode formation region may be removed using a plasma dry etching method, and then, gate electrode 107 may be formed by a lift-off method.

In this way, in the manufacturing method of nitride semiconductor device 100 according to this exemplary embodiment, p-type conductive layer 106 is formed after diffusion suppression layer 105 is formed. Accordingly, when p-type conductive layer 106 is formed, it is possible to suppress Mg which is the p-type dopant from being diffused to barrier layer 104 from p-type conductive layer 106. That is, it is possible to manufacture nitride semiconductor device 100 capable of improving contact resistance and sheet resistance.

Further, nitride semiconductor device 100 according to this exemplary embodiment includes diffusion suppression layer 105 represented as $In_tAl_uGa_{1-t-u}N$ (t=0.05 and u=0.05) and p-type conductive layer 106 represented as $In_xAl_yGa_{1-x-y}N$ (x=0.05 and y=0.05) having the p-type conductivity.

Since In is included in diffusion suppression layer 105 and p-type conductive layer 106 in this way, it is possible to easily remove diffusion suppression layer 105 and p-type conductive layer 106 outside the gate electrode formation region using a plasma dry etching method in manufacturing. Specifically, a lattice constant difference between InN, and GaN and AlN is greater than a lattice constant difference between AlN and GaN. Accordingly, it is possible to manufacture $In_tAl_uGa_{1-t-u}N$ ($0 \leq t+u \leq 1$) in which an immiscible property between diffusion suppression layer 105 and p-type conductive layer 106 is high, and thus, it is possible to easily perform plasma dry etching. In doesn't have to be included in each of diffusion suppression layer 105 and p-type conductive layer 106.

Further, nitride semiconductor device 100 according to this exemplary embodiment includes p-type conductive layer 106 represented as $In_xAl_yGa_{1-x-y}N$ (x=0.05 and y=0.05) having the p-type conductivity.

Since In and Al are included in p-type conductive layer 106 in this way, it is possible to suppress Mg which is the p-type dopant from being diffused during growth of p-type conductive layer 106 (FIG. 5(c)). In and Al don't have to be included in p-type conductive layer 106.

Modification Example 1 of First Exemplary Embodiment

Hereinafter, Modification Example 1 of the first exemplary embodiment will be described with reference to FIG. 6.

A nitride semiconductor device according to this modification example is an example of a semiconductor device in the present disclosure, and is approximately the same as nitride semiconductor device 100 according to the first exemplary embodiment, but is different therefrom in that In is not included in the diffusion suppression layer.

Figure 6:
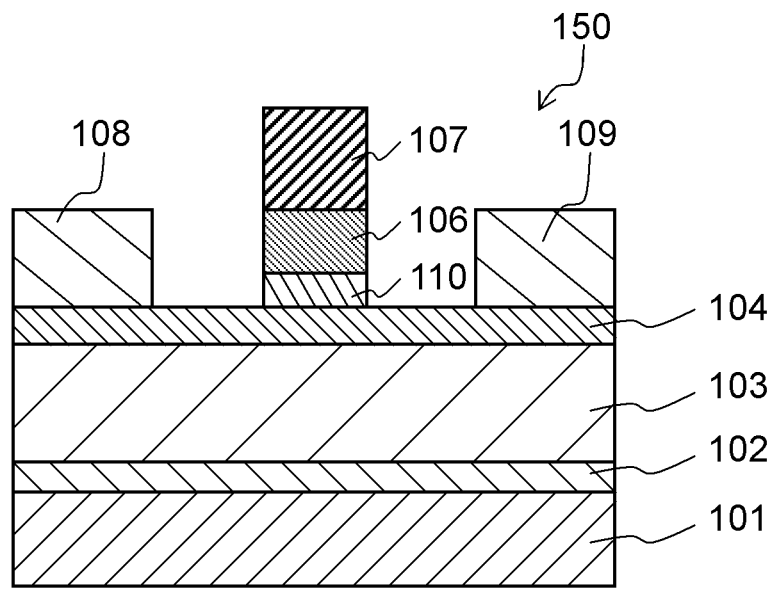
FIG. 6 is a sectional view illustrating a configuration of a nitride semiconductor device according to Modification Example 1 of the first exemplary embodiment.

FIG. 6 is a sectional view illustrating a configuration of nitride semiconductor device 150 according to Modification Example 1 of the first exemplary embodiment.

Nitride semiconductor device 150 according to this modification example has a structure in which diffusion suppression section 105 represented as $In_t Al_u Ga_{1-t-u} N$ (t=0.05 and u=0.05) in nitride semiconductor device 100 according to the first exemplary embodiment shown in FIG. 4 is replaced with diffusion suppression layer 110 represented as undoped $Al_u Ga_{1-u} N$ (u=0.03). Here, the "undoped" means that impurities are not intentionally introduced.

A film thickness of diffusion suppression layer 110 is 25 nm. Since diffusion suppression layer 110 does not include In compared with diffusion suppression layer 105 of nitride semiconductor device 100 according to the first exemplary embodiment, it is possible to improve the immiscible property, and to grow a semiconductor with less crystal defects. Thus, it is possible to suppress electrostatic breakdown due to the crystal defects, for example, and to enhance reliability of nitride semiconductor device 150.

Further, in a process of removing p-type conductive layer 106 and diffusion suppression layer 110 outside the gate electrode formation region, the composition of Al in diffusion suppression layer 110 represented as AlGaN is low with respect to barrier layer 104 represented as $In_r Al_s Ga_{1-r-s} N$ (r=0.09 and s=0.32). Thus, an etching rate of diffusion suppression layer 110 represented as AlGaN is delayed with respect to $In_r Al_s Ga_{1-r-s} N$ (r=0.09 and s=0.32) barrier layer 104 in a plasma dry etching where oxygen is added to an F-based gas or a Cl-based gas, and thus, it is possible to selectively etch diffusion suppression layer 110 represented as AlGaN.

That is, the relationship between the composition of Al in barrier layer 104 represented as $In_r Al_s Ga_{1-r-s} N$ (r=0.09 and s=0.32) and the composition of Al in diffusion suppression layer 110 represented as $Al_u Ga_{1-u} N$ (u=0.03) satisfies s>u. Accordingly, nitride semiconductor device 150 according to this exemplary embodiment achieves the same effects as in the first exemplary embodiment. That is, since the composition of Al in barrier layer 104 is higher than the composition of Al in diffusion suppression layer 110, it is possible to selectively etch diffusion suppression layer 110 represented as AlGaN in the plasma dry etching where oxygen is added to the F-based gas or the Cl-based gas. Thus, it is possible to suppress reduction in the concentration of the two-dimensional electron gas.

As described above, nitride semiconductor device 150 according to Modification Example 1 of the first exemplary embodiment includes diffusion suppression layer 110 represented as undoped $Al_u Ga_{1-u} N$ (u=0.03). Since In is not included in diffusion suppression layer 110 in this way, in nitride semiconductor device 150 according to this modification example, it is possible to enhance reliability compared with nitride semiconductor device 100 according to the first exemplary embodiment.

The manufacturing method of nitride semiconductor device 150 according to this modification example is approximately the same as the manufacturing process of nitride semiconductor device 100 according to the first exemplary embodiment, but is different therefrom in that diffusion suppression layer 110 instead of diffusion suppression layer 105 is formed after barrier layer 104 is formed, and gate electrode 107a, p-type conductive layer 106, and diffusion suppression layer 110 are removed outside the gate electrode formation region by the plasma dry etching. Hence, nitride semiconductor device 150 is manufactured.

Modification Example 2 of First Exemplary Embodiment

Next, Modification Example 2 of the first exemplary embodiment will be described. A nitride semiconductor device according to this modification example is an example of the semiconductor device in the present disclosure, and is approximately the same as nitride semiconductor device 100 according to the first exemplary embodiment, but is different therefrom in that In and Al are not included in the diffusion suppression layer.

Figure 7:
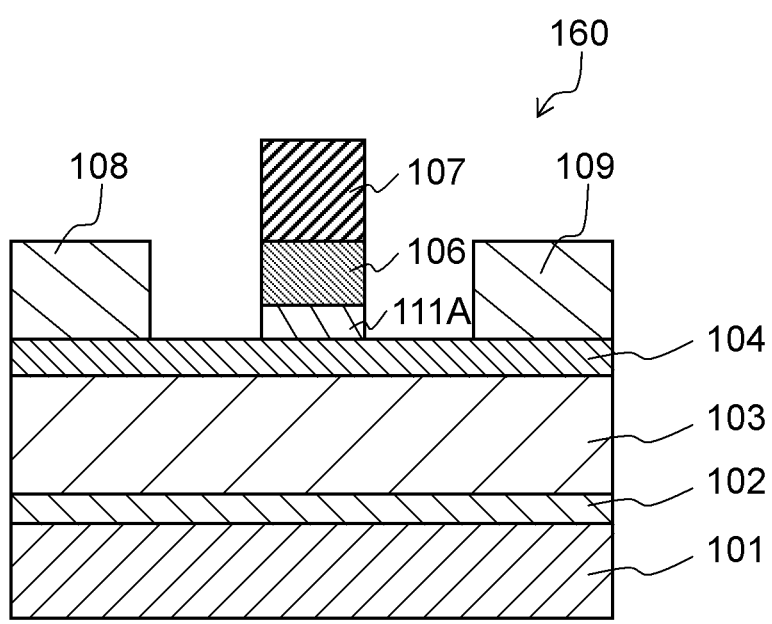
FIG. 7 is a sectional view illustrating a configuration of a nitride semiconductor device according to Modification Example 2 of the first exemplary embodiment.

FIG. 7 is a sectional view illustrating a configuration of nitride semiconductor device 160 according to Modification Example 2 of the first exemplary embodiment.

Nitride semiconductor device 160 according to this modification example has a structure in which diffusion suppression section 105 represented as $In_t Al_u Ga_{1-t-u} N$ (t=0.05 and u=0.05) in nitride semiconductor device 100 according to the first exemplary embodiment shown in FIG. 4 is replaced with diffusion suppression layer 111A represented as undoped GaN.

A film thickness of diffusion suppression layer 111A is 25 nm. In and Al are not included in diffusion suppression layer 111A, compared with diffusion suppression layer 105 in the first exemplary embodiment. That is, compared with diffusion suppression layer 110 in Modification Example 1 of the first exemplary embodiment, Al is not included. With this configuration, nitride semiconductor device 160 according to this modification example has the following effects.

Specifically, in a process of removing p-type conductive layer 106 and diffusion suppression layer 111A outside the gate electrode formation region, diffusion suppression layer 111A does not include Al. Thus, diffusion suppression layer 111A can be quickly and selectively removed at a plasma dry etching rate compared with barrier layer 104. Thus, it is possible to suppress an etching amount of barrier layer 104, and to suppress reduction in the concentration of the two-dimensional electron gas generated on the interface between barrier layer 104 and channel layer 103.

As described above, nitride semiconductor device 160 according to Modification Example 2 of the first exemplary embodiment includes diffusion suppression layer 111A represented as undoped GaN. In this way, Al is not included in diffusion suppression layer 111A in this modification example, compared with diffusion suppression layer 110 in Modification Example 1 of the first exemplary embodiment. Thus, it is possible to easily increase a selection rate of selective etching of diffusion suppression layer 111A with respect to barrier layer 104 including Al. Accordingly, it is possible to further suppress an etching amount of barrier layer 104. Accordingly, it is possible to suppress reduction in the concentration of the two-dimensional electron gas generated on the interface between channel layer 103 and barrier layer 104, that is, to enhance the manufacturing yield.

The manufacturing process of nitride semiconductor device 160 according to this modification example is approximately the same as the manufacturing process of nitride semiconductor device 100 according to the first exemplary embodiment, but is different therefrom in that diffusion suppression layer 111A instead of diffusion suppression layer 105 is formed after barrier layer 104 is formed, and gate electrode layer 107a, p-type conductive layer 106, and diffusion suppression layer 111A outside the gate electrode formation region are removed by the plasma dry etching. Hence, nitride semiconductor device 160 is manufactured.

Modification Example 3 of First Exemplary Embodiment

Next, Modification Example 3 of the first exemplary embodiment will be described. A nitride semiconductor device according to this modification example is an example of the semiconductor device in the present disclosure, and is approximately the same as nitride semiconductor device 100 according to Modification Example 2 of the first exemplary embodiment, but is different therefrom in that a diffusion suppression layer is formed as an n-type.

Figure 8:
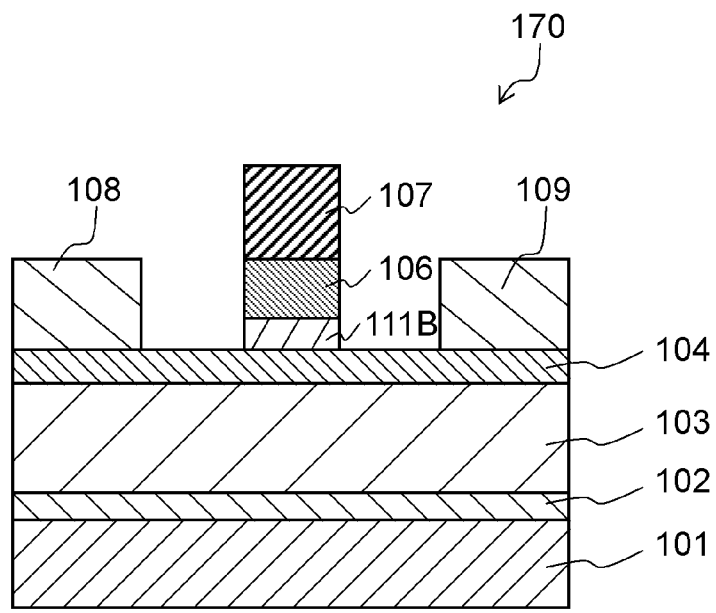
FIG. 8 is a sectional view illustrating a configuration of a nitride semiconductor device according to Modification Example 3 of the first exemplary embodiment.

FIG. 8 is a sectional view illustrating a configuration of nitride semiconductor device 170 according to Modification Example 3 of the first exemplary embodiment.

Nitride semiconductor device 170 according to this modification example has a structure in which diffusion suppression layer 111A represented as undoped GaN shown in FIG. 8 is replaced with diffusion suppression layer 111B represented as n-type GaN.

A film thickness of diffusion suppression layer 111B is 25 nm, an Si concentration is $1 \times 10^{18}/cm^3$. In this way, diffusion suppression layer 111B is different from diffusion suppression layer 111A in Modification Example 2 of the first exemplary embodiment in that diffusion suppression layer 111B is changed into an n-type due to doping of Si which is an n-type dopant. Thus, it is possible to compensate for Mg which is the p-type dopant diffused from p-type conductive layer 106. Accordingly, barrier layer 104 is not easily changed into the p-type.

Further, in a process (FIG. 5(d)) of removing p-type conductive layer 106 and diffusion suppression layer 111B outside the gate electrode formation region, even when diffusion suppression layer 111B cannot be completely removed, Si included in diffusion suppression layer 111B compensates for the change into the p-type due to Mg. Thus, it is possible to easily obtain low contact resistance from diffusion suppression layer 111B, and to enhance the manufacturing yield.

That is, when diffusion suppression layer 111B cannot be completely removed by plasma dry etching and an underlayer of diffusion suppression layer 111B remains, in a subsequent process (FIG. 5(e)) of forming source electrode 108 and drain electrode 109, source electrode 108 and drain electrode 109 are formed on remaining diffusion suppression layer 111B. Here, remaining diffusion suppression layer 111B which is not removed by the plasma dry etching is changed into an i-type (intrinsic type) by compensating for Mg diffused from p-type conductive layer 106, or maintains the n-type. Accordingly, source electrode 108 and drain electrode 109 can obtain low contact resistance from diffusion suppression layer 111B, to thereby make it possible to enhance the manufacturing yield.

As described above, nitride semiconductor device 170 according to Modification Example 3 of the first exemplary embodiment includes n-type diffusion suppression layer 111B having the Si concentration which is equal to or greater than $1 \times 10^{18}/cm^3$. In this way, since diffusion suppression layer 111B in this modification example is the n-type compared with diffusion suppression layer 111A according to Modification Example 2 of the first exemplary embodiment, it is possible to compensate for Mg diffused from p-type conductive layer 106. Accordingly, it is possible to further suppress the change of barrier layer 104 into the p-type, and thus, it is possible to obtain low contact resistance. Further, even when diffusion suppression layer 111B cannot be completely removed by the plasma dry etching, it is possible to obtain the low contact resistance, and to enhance the manufacturing yield. That is, when diffusion suppression layer 111B can be completely removed by the plasma dry etching, and when diffusion suppression layer 111B cannot be completely removed, it is possible to obtain the low contact resistance, and to enhance the manufacturing yield. Accordingly, highly accurate etching is not necessary, and thus, the manufacturing is easily performed.

A manufacturing process of nitride semiconductor device 170 according to this modification example is approximately the same as the manufacturing process of nitride semiconductor device 100 according to the first exemplary embodiment, but is different therefrom in the following two points. That is, diffusion suppression layer 111B instead of diffusion suppression layer 105 is formed after barrier layer 104 is formed, and gate electrode layer 107a, p-type conductive layer 106, and diffusion suppression layer 111B outside the gate electrode formation region are removed by plasma dry etching. Hence, nitride semiconductor device 170 is manufactured.

Modification Example 4 of First Exemplary Embodiment

Next, Modification Example 4 of the first exemplary embodiment will be described. A nitride semiconductor device according to this modification example is an example of semiconductor device in the present disclosure, and is approximately the same as nitride semiconductor device 160 according to Modification Example 2 of the first exemplary embodiment, but is different therefrom in that a channel layer is made of undoped GaN, a barrier layer is made of undoped AlGaN, and a p-type conductive layer is made of p-type GaN.

Figure 9:
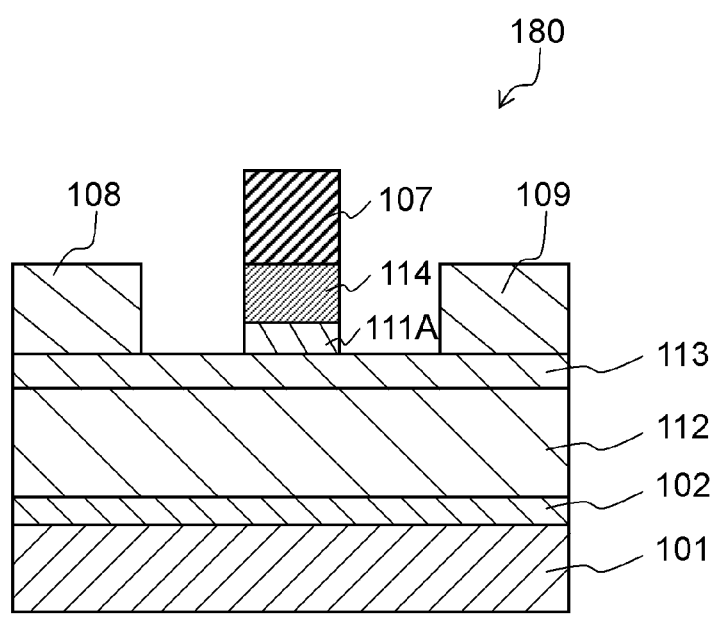
FIG. 9 is a sectional view illustrating a configuration of a nitride semiconductor device according to Modification Example 4 of the first exemplary embodiment.

FIG. 9 is a sectional view illustrating a configuration of nitride semiconductor device 180 according to Modification Example 4 of the first exemplary embodiment.

Nitride semiconductor device 180 according to this modification example has a structure in which channel layer 103 represented as $In_pAl_qGa_{1-p-q}N$ (p=0.05 and q=0.02) in nitride semiconductor device 160 according to Modification Example 2 of the first exemplary embodiment shown in FIG. 7 is replaced with into channel layer 112 represented as undoped-GaN, barrier layer 104 represented as $In_rAl_sGa_{1-r-s}N$ (r=0.09 and s=0.32) is replaced with barrier layer 113 represented as undoped-$Al_sGa_{1-s}N$ (s=0.3), and p-type conductive layer 106 represented as $In_xAl_yGa_{1-x-y}N$ (x=0.05 and y=0.05) having p-type conductivity is replaced with p-type conductive layer 114 represented as p-type GaN. A film thickness of diffusion suppression layer 111A is 25 nm, a film thickness of barrier layer 113 is 10 nm, and a film thickness of p-type conductive layer 114 is 200 nm.

As described above, Al is not included in p-type conductive layer 114 in this modification example, compared with p-type conductive layer 106 in Modification Example 2 of the first exemplary embodiment. Thus, nitride semiconductor device 180 according to this modification example has the following effects.

Specifically, since Al is not included in p-type conductive layer 114, it is possible to grow p-type conductive layer 114 without any limit to a critical film thickness due to lattice distortion generated when Al is included therein, and to obtain p-type conductive layer 114 with less crystal defects. Thus, it is possible to suppress variance in contact resistance with respect to gate electrode 107, and to enhance the yield.

Further, in a process of removing p-type conductive layer 114 and diffusion suppression layer 111A outside the gate electrode formation region, since Al is not included in each of p-type conductive layer 114 and diffusion suppression layer 111A, it is possible to quickly and selectively remove p-type conductive layer 114 and diffusion suppression layer 111A with a plasma dry etching rate compared with barrier layer 113. Thus, it is possible to suppress an etching amount of barrier layer 113, and to suppress reduction in the concentration of the two-dimensional electron gas generated on the interface between barrier layer 113 and channel layer 112.

Further, In and Al are not included in channel layer 112 in this modification example, compared with channel layer 103 in Modification Example 2 of the first exemplary embodiment, and In is not included in barrier layer 113 in this modification example, compared with barrier layer 104 in Modification Example 2 of the first exemplary embodiment. Thus, nitride semiconductor device 180 according to this modification example has the following effects.

Specifically, since In and Al are not included in channel layer 112, it is possible to suppress crystal defects, and to enhance the manufacturing yield. Further, since In is not included in barrier layer 113, it is possible to suppress crystal defects, and to enhance the manufacturing yield.

As described above, nitride semiconductor device 180 according to Modification Example 4 of the first exemplary embodiment includes p-type conductive layer 114 represented as p-type GaN. In this way, since Al is not included in p-type conductive layer 114, in nitride semiconductor device 180 according to this modification example, it is possible to grow p-type conductive layer 114 without any limit to a critical film thickness due to lattice distortion generated when Al is included therein, and to obtain p-type conductive layer 114 with less crystal defects. Thus, it is possible to suppress variance in contact resistance with respect to gate electrode 107, and to enhance the yield.

A manufacturing process of nitride semiconductor device 180 according to this modification example is approximately the same as the manufacturing process of nitride semiconductor device 100 according to the first exemplary embodiment. That is, buffer layer 102, channel layer 112, barrier layer 113, diffusion suppression layer 111A, and p-type conductive layer 114 are sequentially formed on Si substrate 101 by a metal organic chemical vapor deposition (MOCVD) method. Then, gate electrode layer 107a is formed using a vacuum deposition method or a sputtering method, and then, gate electrode layer 107a, p-type conductive layer 114, and diffusion suppression layer 111A outside the gate electrode formation region are removed. Then, source electrode 108 and drain electrode 109 are formed on barrier layer 113 using a vacuum deposition method or a sputtering method. Hence, nitride semiconductor device 180 is manufactured.

Modification Example 5 of First Exemplary Embodiment

Next, Modification Example 5 of the first exemplary embodiment will be described. A nitride semiconductor device according to this modification example is an example of a semiconductor device, and is approximately the same as nitride semiconductor device 100 according to the first exemplary embodiment, but is different therefrom in the following points. That is, a diffusion suppression layer has a stacked structure of a semiconductor layer represented as n-type $Al_uGa_{1-u}N$ (u=0.03) and a semiconductor layer represented as undoped $Al_aGa_{1-a}N$.

Figure 10:
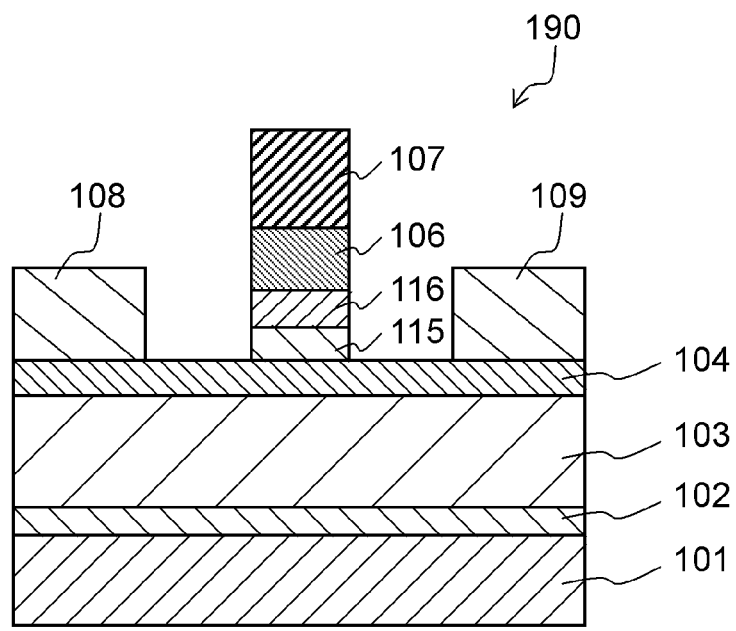
FIG. 10 is a sectional view illustrating a configuration of a nitride semiconductor device according to Modification Example 5 of the first exemplary embodiment.

FIG. 10 is a sectional view illustrating a configuration of nitride semiconductor device 190 according to Modification Example 5 of the first exemplary embodiment.

Nitride semiconductor device 190 according to this modification example has a structure in which diffusion suppression layer 105 represented as $In_tAl_uGa_{1-t-u}N$ (t=0.05 and u=0.05) in nitride semiconductor device 100 according to the first exemplary embodiment shown in FIG. 4 is replaced with a stacked structure of diffusion suppression layer 115 represented as n-type $Al_uGa_{1-u}N$ (u=0.03) and diffusion suppression layer 116 represented as undoped $Al_aGa_{1-a}N$ (a=0.03).

A film thickness of diffusion suppression layer 115 made of n-type AlGaN is 5 nm, an Si concentration is $1\times10^{18}/cm^3$, and a film thickness of diffusion suppression layer 116 made of undoped AlGaN is 20 nm. Since Mg is not easily diffused in AlGaN compared with GaN, it is possible to suppress Mg from being diffused to barrier layer 104 due to the existence of diffusion suppression layer 115 made of n-type AlGaN and diffusion suppression layer 116 made of undoped AlGaN, compared with a case where Al is not included therein.

Further, diffusion suppression layer 115 is changed into an n-type due to doping of Si which is the n-type dopant. Thus, it is possible to compensate for Mg which is the p-type dopant diffused from p-type conductive layer 106 through diffusion suppression layer 116 made of undoped AlGaN. Accordingly, barrier layer 104 is not easily changed into the p-type.

Further, in a process of removing p-type conductive layer 106, diffusion suppression layer 115 made of n-type AlGaN, and diffusion suppression layer 116 made of undoped AlGaN outside the gate electrode formation region, even when diffusion suppression layer 115 made of n-type AlGaN cannot be completely removed, since Si included in diffusion suppression layer 115 compensates for the change into the p-type due to Mg, it is possible to easily obtain low contact resistance from diffusion suppression layer 115, and to enhance the manufacturing yield.

That is, when diffusion suppression layer 115 cannot be completely removed by the plasma dry etching and an underlayer of diffusion suppression layer 115 remains, in a subsequent process (FIG. 5(e)) of forming source electrode 108 and drain electrode 109, source electrode 108 and drain electrode 109 are formed on remaining diffusion suppression layer 115. Here, remaining diffusion suppression layer 115 which is not removed by the plasma dry etching is changed into an i-type (intrinsic type) by compensating for Mg diffused from p-type conductive layer 106 through diffusion suppression layer 116, or maintains the n-type. Accordingly, source electrode 108 and drain electrode 109 can obtain low contact resistance from diffusion suppression layer 115, to thereby make it possible to enhance the manufacturing yield.

As described above, nitride semiconductor device 190 according to Modification Example 5 of the first exemplary embodiment includes the stacked structure of diffusion suppression layer 115 made of n-type AlGaN having the Si concentration which is equal to or greater than $1\times10^{18}/cm^3$ and diffusion suppression layer 116 made of undoped AlGaN, as an example of a third semiconductor layer. In this way, since Al is included in diffusion suppression layer 115 and diffusion suppression layer 116, it is possible to further suppress Mg from being diffused to barrier layer 104 from p-type conductive layer 106, compared with a case where Al is not included therein. Accordingly, it is possible to obtain the low contact resistance.

Further, since diffusion suppression layer 115 is the n-type, it is possible to compensate for Mg diffused from p-type conductive layer 106 through diffusion suppression layer 116. Accordingly, it is possible to further suppress the change of barrier layer 104 into the p-type, and thus, it is possible to obtain low contact resistance. Further, even when diffusion suppression layer 115 cannot be completely removed by the plasma dry etching, it is possible to obtain the low contact resistance, and to enhance the manufacturing yield. That is, when diffusion suppression layer 115 can be completely removed by the plasma dry etching, and when diffusion suppression layer 115 cannot be completely removed, it is possible to obtain the low contact resistance, and to enhance the manufacturing yield. Accordingly, highly accurate etching is not necessary, and thus, the manufacturing of the device is easily performed.

Diffusion suppression layer 115 doesn't have to have the n-type. With such a configuration, similarly, since Al is included in diffusion suppression layer 115, it is possible to further suppress Mg from being diffused to barrier layer 104 from p-type conductive layer 106, compared with a case where Al is not included therein. Accordingly, it is possible to obtain the low contact resistance.

Further, diffusion suppression layer 116 may be a semiconductor layer made of GaN, and diffusion suppression layer 116 made of GaN may have an Si concentration which is equal to or greater than $1\times10^{18}/cm^3$.

Thus, since diffusion suppression layer 116 is the n-type, even when diffusion suppression layer 116 cannot be completely removed by the plasma dry etching, since Si of diffusion suppression layer 116 compensates for the change into the p-type due to Mg, it is possible to easily obtain the low contact resistance from diffusion suppression layer 116, and to enhance the manufacturing yield.

A manufacturing process of nitride semiconductor device 190 according to this modification example is approximately the same as the manufacturing process of nitride semiconductor device 100 according to the first exemplary embodiment, but is different therefrom in the following two points. That is, diffusion suppression layer 115 and diffusion suppression layer 116 instead of diffusion suppression layer 105 are formed after barrier layer 104 is formed, and gate electrode layer 107a, p-type conductive layer 106, diffusion suppression layer 115, and diffusion suppression layer 116 outside the gate electrode formation region are removed by plasma dry etching. Hence, nitride semiconductor device 190 is manufactured.

Second Exemplary Embodiment

Hereinafter, a second exemplary embodiment will be described with reference to FIG. 11. A nitride semiconductor device according to this exemplary embodiment is an example of a semiconductor device, and is approximately the same as nitride semiconductor device 100 according to the first exemplary embodiment, but is different therefrom in that a cap layer formed on barrier layer 104 is provided. In the respective exemplary embodiments described below, the same reference numerals are given to substantially the same components as in the first exemplary embodiment, and description thereof may be omitted.

Figure 11:
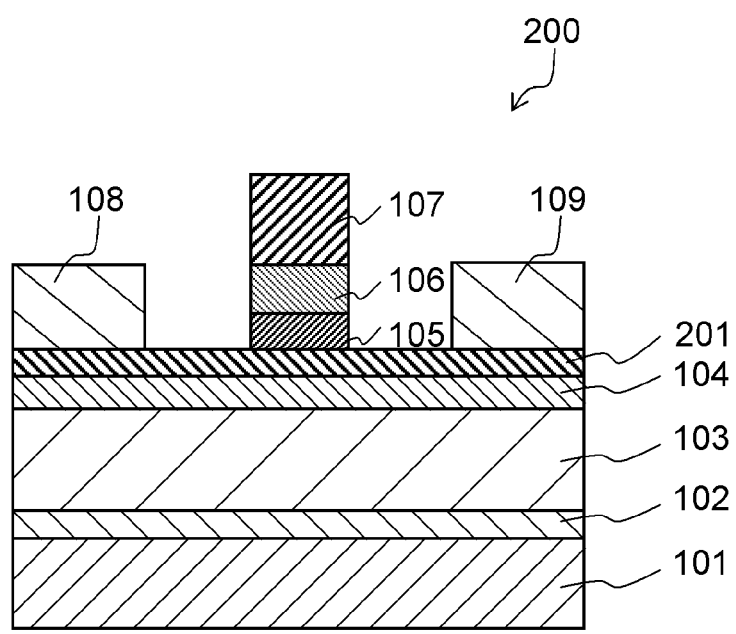
FIG. 11 is a sectional view illustrating a configuration of a nitride semiconductor device according to a second exemplary embodiment.

FIG. 11 is a sectional view illustrating a configuration of nitride semiconductor device 200 according to the second exemplary embodiment of the present disclosure.

Nitride semiconductor device 200 includes Si substrate 101 in which a (111) plane is a main plane, for example, buffer layer 102 made of AlN provided on the (111) plane of Si substrate 101, channel layer 103 represented as $In_pA_qGa_{1-p-q}N$ (p=0.05 and q=0.02) provided on buffer layer 102, barrier layer 104 represented as $In_rAl_sGa_{1-r-s}N$ (r=0.09 and s=0.32) provided on channel layer 103, cap layer 201 represented as n-type AlGaN (in which the composition of Al is 20%) provided on barrier layer 104, diffusion suppression layer 105 represented as $In_tAl_uGa_{1-t-u}N$ (t=0.05 and u=0.05) which is partially provided on cap layer 201, and p-type conductive layer 106 represented as $In_xAl_yGa_{1-x-y}N$ (x=0.05 and y=0.05) having p-type conductivity, provided on diffusion suppression layer 105.

For example, a film thickness of the buffer layer is 100 nm, a film thickness of channel layer 103 is 2 μm, a film thickness of barrier layer 104 is 30 nm, a film thickness of the cap layer made of n-type AlGaN is 5 nm, a film thickness of diffusion suppression layer 105 is 25 nm, and a film thickness of p-type conductive layer 106 is 200 nm.

Gate electrode 107 made of nickel (Ni) is formed on p-type conductive layer 106. Source electrode 108 and drain electrode 109 which are respectively made of titanium (Ti)/Aluminum (Al) are formed on both sides of gate electrode 107 so as to be in contact with cap layer 201 made of n-type AlGaN.

For example, Mg of $5\times10^{19}/cm^3$ is doped in p-type conductive layer 106 which is a p-type layer. That is, Mg diffused from p-type conductive layer 106 is included in diffusion suppression layer 105, but its concentration is equal to or smaller than $1\times10^{19}/cm^3$ in a portion that is in contact with cap layer 201 made of n-type AlGaN. Cap layer 201 made of n-type AlGaN has an Mg concentration which is equal to or smaller than $1\times10^{19}/cm^3$ in a portion that is in contact with diffusion suppression layer 105. Thus, it is possible to suppress change of cap layer 201 made of n-type AlGaN into a p-type. Further, Si included in cap layer 201 made of n-type AlGaN can compensate for the change into the p-type due to Mg. As a result, it is possible to suppress increase in sheet resistance, to achieve ohmic contact between source electrode 108 and drain electrode 109, and to obtain excellent on-resistance.

As described above, nitride semiconductor device 200 according to this exemplary embodiment further includes cap layer 201 made of n-type AlGaN formed on barrier layer 104, compared with nitride semiconductor device 100 according to the first exemplary embodiment. In other words, nitride semiconductor device 200 according to this exemplary embodiment has a structure in which a layer in which Si is not doped, formed on a side being in contact with barrier layer 104 and a layer having an Si concentration which is equal to or greater than $1\times10^{18}/cm^3$, formed on a side being in contact with source electrode 108 and drain electrode 109, are stacked. The stacked structure of barrier layer 104 and cap layer 201 according to this exemplary embodiment is an example of the second semiconductor layer.

According to this configuration, since cap layer 201 which is the n-type layer is in contact with source electrode 108 and drain electrode 109, it is possible to reduce the contact resistance. Further, since the entirety of the semiconductor layer (second semiconductor layer) between channel layer 103 and diffusion suppress layer 105 is not changed into the n-type, it is possible to suppress leakage current to enhance pressure-resistance, compared with a configuration in which the entirety of the semiconductor layer is the n-type.

Accordingly, since cap layer 201 which is the n-type semiconductor layer is formed on barrier layer 104, it is possible to compensate for Mg which is the p-type dopant diffused from p-type conductive layer 106 through diffusion suppression layer 105. In this exemplary embodiment, since source electrode 108 and drain electrode 109 are formed on cap layer 201, nitride semiconductor device 200 according to this exemplary embodiment can further suppress increase in the contact resistance and the sheet resistance, compared with nitride semiconductor device 100 according to the first exemplary embodiment.

A manufacturing process of nitride semiconductor device 200 according to this exemplary embodiment is approximately the same as the manufacturing process of nitride semiconductor device 100 according to the first exemplary embodiment, but is different therefrom in that cap layer 201 is formed by a MOCVD method after barrier layer 104 is formed and before diffusion suppression layer 105 is formed. Hence, nitride semiconductor device 200 is manufactured.

Third Exemplary Embodiment

Next, a third exemplary embodiment will be described with reference to FIG. 12. A nitride semiconductor device according to this exemplary embodiment is an example of a semiconductor device, and is approximately the same as nitride semiconductor device 100 according to the first exemplary embodiment, but is different therefrom in the following point. That is, a p-type conductive layer made of p-type AlGaN formed between diffusion suppression layer 105 and p-type conductive layer 106 is provided.

Figure 12:
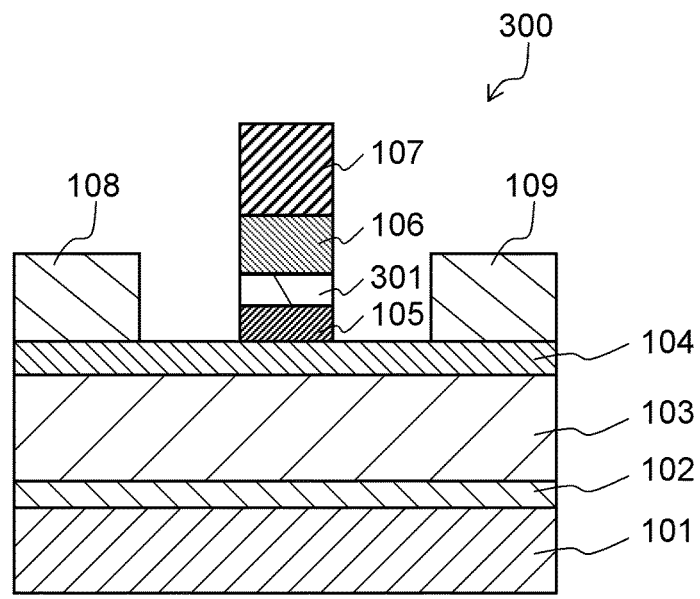
FIG. 12 is a sectional view illustrating a configuration of a nitride semiconductor device according to a third exemplary embodiment.

FIG. 12 is a sectional view illustrating a configuration of nitride semiconductor device 300 according to the third exemplary embodiment of the present disclosure.

Nitride semiconductor device 300 includes Si substrate 101 in which a (111) plane is a main plane, for example, buffer layer 102 made of AlN provided on the (111) plane of Si substrate 101, channel layer 103 represented as $In_pAl_qGa_{1-p-q}N$ (p=0.05 and q=0.02) provided on buffer layer 102, barrier layer 104 represented as $In_rAl_sGa_{1-r-s}N$ (r=0.09 and s=0.32) provided on channel layer 103, diffusion suppression layer 105 represented as $In_tAl_uGa_{1-t-u}N$ (t=0.05 and u=0.05) which is partially provided on barrier layer 104, p-type conductive layer 301 which is a semiconductor layer having p-type conductivity, represented as $Al_aGa_{1-a}N$ (a=0.2), provided on diffusion suppression layer 105, and p-type conductive layer 106 represented as $In_xAl_yGa_{1-x-y}N$ (x=0.05 and y=0.05) having p-type conductivity, provided on p-type conductive layer 301.

For example, a film thickness of the buffer layer is 100 nm, a film thickness of channel layer 103 is 2 μm, a film thickness of barrier layer 104 is 30 nm, a film thickness of diffusion suppression layer 105 is 25 nm, a film thickness of p-type conductive layer 301 made of p-type AlGaN is 15 nm, and a film thickness of p-type conductive layer 106 is 200 nm.

Gate electrode 107 made of nickel (Ni) is formed on p-type conductive layer 106.

Source electrode 108 and drain electrode 109 which are respectively made of titanium (Ti)/Aluminum (Al) are formed on both sides of gate electrode 107 so as to be in contact with barrier layer 104.

For example, Mg of $5\times10^{19}/cm^3$ is doped in p-type conductive layer 301 made of p-type AlGaN and p-type conductive layer 106 made of p-type InAlGaN, respectively.

That is, Mg diffused from p-type conductive layer 301 made of p-type AlGaN and p-type conductive layer 106 made of p-type InAlGaN is included in diffusion suppression layer 105. An Mg concentration thereof is equal to or smaller than $1\times10^{19}/cm^3$ in a portion that is in contact with barrier layer 104. Barrier layer 104 has an Mg concentration which is equal to or smaller than $1\times10^{19}/cm^3$ in a portion that is in contact with diffusion suppression layer 105. Thus, it is possible to suppress change of barrier layer 104 into a p-type. As a result, it is possible to reduce deterioration in sheet resistance, to achieve ohmic contact between source electrode 108 and drain electrode 109, and to obtain excellent on-resistance.

Further, since p-type conductive layer 301 made of p-type AlGaN is present in nitride semiconductor device 300 according to this exemplary embodiment, a large built-in potential is obtained compared with a case where only a p-type GaN layer is formed as a p-type semiconductor layer. Thus, a threshold voltage of a gate becomes large, a normally-off state is easily secured, and thus, the manufacturing yield is enhanced. Further, it is possible to increase a carrier density of the two-dimensional electron gas corresponding to the increment of the threshold voltage of the gate in a range where the normally-off state can be maintained, and to reduce sheet resistance. Thus, it is possible to reduce on-resistance.

As described above, nitride semiconductor device 300 according to this exemplary embodiment further includes p-type conductive layer 301 made of p-type AlGaN formed between diffusion suppression layer 105 and p-type conductive layer 106 made of p-type InAlGaN, compared with nitride semiconductor device 100 according to the first exemplary embodiment. The stacked structure of p-type conductive layer 301 and p-type conductive layer 106 according to this exemplary embodiment is an example of a fourth semiconductor layer.

In this way, since p-type conductive layer 301 made of p-type AlGaN is formed, nitride semiconductor device 300 according to this exemplary embodiment easily maintains the normally-off state, compared with nitride semiconductor device 100 according to the first exemplary embodiment. Specifically, since a bandgap of p-type conductive layer 301 made of p-type AlGaN is large, it is possible to greatly change the position of a Fermi level as much. In other words, it is possible to bring the Fermi level close to a valence band. Then, since the large built-in potential can be obtained, the threshold voltage of the gate becomes large, and thus, the normally-off state is easily secured. Further, it is possible to increase a carrier density of the two-dimensional electron gas corresponding to the increment of the threshold voltage of the gate in a range where the normally-off state can be maintained, and to reduce sheet resistance. In order to increase the carrier density of the two-dimensional electron gas, the bandgap of barrier layer 104 may be set to be large, or the film thickness may be set to be thick.

In this exemplary embodiment, a semiconductor layer made of GaN may be used instead of p-type conductive layer 106 made of p-type InAlGaN. That is, as an example of the fourth semiconductor layer, a stacked structure of p-type conductive layer 301 made of $Al_zGa_{1-z}N$ (0<z≤1) formed on a side being in contact with diffusion suppression layer 105 and a p-type semiconductor layer made of GaN formed on a side being in contact with gate electrode 107 may be provided.

According to this configuration, since p-type conductive layer 301 made of AlGaN can increase the built-in potential, it is possible to increase the density of the two-dimensional electron gas in the normally-off state, and to reduce the sheet resistance. Further, it is possible to grow a p-type semiconductor layer made of GaN on p-type conductive layer 301 made of the AlGaN without any limit to a critical film thickness due to lattice distortion. Accordingly, as a stacked structure of p-type conductive layer 301 made of AlGaN and a p-type semiconductor layer made of GaN, it is possible to obtain a p-type semiconductor layer with less crystal defects. Thus, it is possible to suppress variance in contact resistance with respect to gate electrode 107, and to enhance the yield.

A manufacturing process of nitride semiconductor device 300 according to this exemplary embodiment is approximately the same as the manufacturing process of nitride semiconductor device 100 according to the first exemplary embodiment, and is different therefrom in the following two points. That is, p-type conductive layer 301 made of p-type AlGaN is formed by a MOCVD method after diffusion suppression layer 105 is formed and before p-type conductive layer 106 is formed. Further, gate electrode layer 107a, p-type conductive layer 106, p-type conductive layer 301, and diffusion suppression layer 105 outside the gate electrode formation region are removed by plasma dry etching. Hence, nitride semiconductor device 300 is manufactured.

Fourth Exemplary Embodiment

Figure 13:
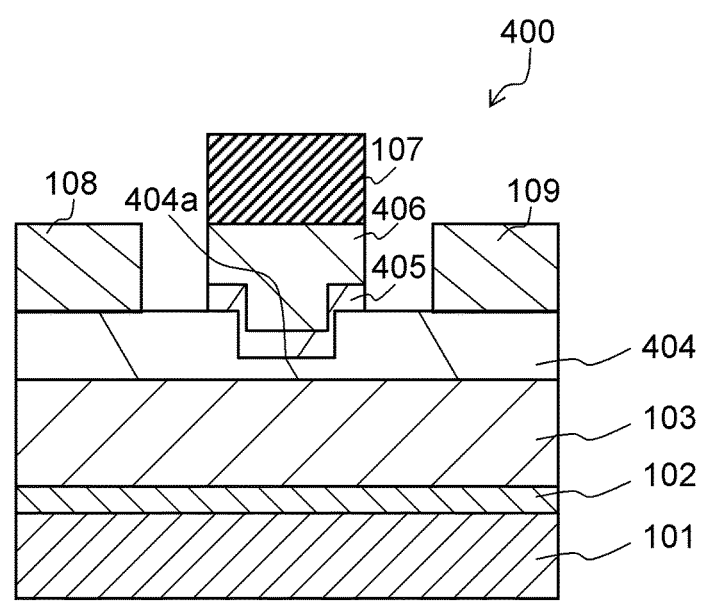
FIG. 13 is a sectional view illustrating a configuration of a nitride semiconductor device according to a fourth exemplary embodiment.

Next, a fourth exemplary embodiment will be described with reference to FIG. 13. A nitride semiconductor device according to this exemplary embodiment is an example of a semiconductor device, and is approximately the same as nitride semiconductor device 100 according to the first exemplary embodiment, but is different therefrom in the following points. That is, an upper surface of a barrier layer has a recessed portion formed under gate electrode 107 and a diffusion suppression layer is formed to be buried in the recessed portion.

FIG. 8 is a sectional view illustrating a configuration of nitride semiconductor device 400 according to the fourth exemplary embodiment of the present disclosure.

Nitride semiconductor device 400 includes Si substrate 101 in which a (111) plane is a main plane, for example, buffer layer 102 made of AlN provided on the (111) plane of Si substrate 101, channel layer 103 represented as $In_pAl_qGa_{1-p-q}N$ (p=0.05 and q=0.02) provided on buffer layer 102, barrier layer 404 represented as $In_rAl_sGa_{1-r-s}N$ (r=0.09 and s=0.32) provided on channel layer 103, diffusion suppression layer 405 represented as $In_tAl_uGa_{1-t-u}N$ (t=0.05 and u=0.05) which is partially provided on barrier layer 404, and p-type conductive layer 406 represented as $In_xAl_yGa_{1-x-y}N$ (x=0.05 and y=0.05) having p-type conductivity, provided on diffusion suppression layer 405. Further, on an upper surface of barrier layer 404, concave portion 404a in which lower portions of diffusion suppression layer 405 and p-type conductive layer 406 are buried is formed.

A film thickness of buffer layer 102 is 100 nm, a film thickness of channel layer 103 is 2 μm, a film thickness of barrier layer 404 in a region other than concave portion 404a is 50 nm, a film thickness of diffusion suppression layer 405 is 25 nm, and a film thickness of p-type conductive layer 406 is 200 nm.

Gate electrode 107 made of nickel (Ni) is formed on p-type conductive layer 406.

Source electrode 108 and drain electrode 109 which are respectively made of titanium (Ti)/Aluminum (Al) are formed on both sides of gate electrode 107 so as to be in contact with barrier layer 404.

Mg of $5 \times 10^{19}/cm^3$ is doped in p-type conductive layer 406.

Mg diffused from p-type conductive layer 406 is included in diffusion suppression layer 405, but its concentration is equal to or smaller than $1 \times 10^{19}/cm^3$ in a portion that is in contact with barrier layer 404. Barrier layer 404 has an Mg concentration which is equal to or smaller than $1 \times 10^{19}/cm^3$ in a portion that is in contact with diffusion suppression layer 405. Thus, it is possible to suppress change of barrier layer 404 into a p-type. As a result, it is possible to reduce deterioration in sheet resistance, to achieve ohmic contact between source electrode 108 and drain electrode 109, and to obtain excellent on-resistance.

Further, it is possible to alleviate an electric field that concentrates on a drain end of gate electrode 107 or a drain end of p-type conductive layer 406 due to concave portion 404a, to thereby suppress current collapse due to the electric field concentration, or to suppress electrostatic breakdown of the device.

Further, when a concave portion is not formed as in barrier layer 104 in the first exemplary embodiment, the entire composition and film thickness of barrier layer 104 are limited so as to realize the normally-off state of the device. On the other hand, when concave portion 404a is formed as in barrier layer 404 in this exemplary embodiment, the composition and film thickness of barrier layer 404 under concave portion 404a have a limit in a range where the normally-off state is realized, but the composition and film thickness of barrier layer 404 in a region other than under concave portion 404a can be arbitrarily set. Thus, in nitride semiconductor device 400 according to this exemplary embodiment, the composition and film thickness of barrier layer 404 in the region other than under concave portion 404a may be designed so that the carrier density of the two-dimensional electron gas increases, to thereby reduce sheet resistance and to reduce on-resistance. For example, in order to increase the carrier density of the two-dimensional electron gas in the region other than under concave portion 404a, the composition of barrier layer 404 in the region other than under concave portion 404a may be set so that a bandgap becomes large, or the film thickness of barrier layer 404 in the region other than under concave portion 404a may be set to be thick.

That is, in order to set nitride semiconductor device 400 to a normally-off type, it is necessary to lower the carrier density of the two-dimensional electron gas under gate electrode 107. That is, it is necessary to cancel piezoelectric polarization generated on an interface between channel layer 103 and barrier layer 404 by piezoelectric polarization generated on an interface between diffusion suppression layer 405 and p-type conductive layer 406, under gate electrode 107. Accordingly, the composition and film thickness of barrier layer 404 under gate electrode 107 are limited to a composition and a film thickness capable of setting nitride semiconductor device 400 to the normally-off type. However, reduction in the carrier density of the two-dimensional electron gas causes deterioration in sheet resistance.

Thus, nitride semiconductor device 400 according to this exemplary embodiment is configured so that concave portion 404a is formed in barrier layer 404 and lower parts of diffusion suppression layer 405 and p-type conductive layer 406 are buried in concave portion 404a, to thereby realize an excellent normally-off type in sheet resistance.

As described above, in nitride semiconductor device 400 according to this exemplary embodiment, barrier layer 404 includes concave portion 404a formed on an upper surface thereof, and diffusion suppression layer 405 is formed to fill concave portion 404a, compared with nitride semiconductor device 100 according to the first exemplary embodiment.

In this way, since concave portion 404a is formed on barrier layer 404 under gate electrode 107, nitride semiconductor device 400 according to this exemplary embodiment has the following effects. Specifically, it is possible to alleviate an electric field that concentrates on the drain end of gate electrode 107 or the drain end of p-type conductive layer 406. Accordingly, it is possible to suppress current collapse due to electric field concentration, or to prevent breakdown of nitride semiconductor device 400 due to electric field concentration.

Further, when a concave portion is not formed as in barrier layer 104 in the first exemplary embodiment, the composition and film thickness of barrier layer 104 are limited so as to realize the normally-off state of nitride semiconductor device 100. On the other hand, when concave portion 404a is formed as in barrier layer 404 in this exemplary embodiment, the composition and film thickness of barrier layer 404 in a region where concave portion 404a is formed when viewing nitride semiconductor device 400 in a stacking direction have a limit in a range where the normally-off state is realized, but the composition and film thickness of barrier layer 404 in the region other than concave portion 404a can be arbitrarily set. Thus, in nitride semiconductor device 400 according to this exemplary embodiment, the composition and film thickness of barrier layer 404 in the region other than concave portion 404a may be designed so that the carrier density of the two-dimensional electron gas increases, to thereby reduce deterioration in sheet resistance.

In this exemplary embodiment, diffusion suppression layer 405 may be formed to fill at least a part of concave portion 404a, when viewing nitride semiconductor device 400 in the stacking direction. Here, it is more preferable that the concave portion 404a is formed to be entirely filled. That is, it is more preferable that gate electrode 107 is formed to cover concave portion 404a, when viewing nitride semiconductor device 400 in the stacking direction.

In this way, since gate electrode 107 covers concave portion 404a, it is possible to suppress variation of on-resistance due to process factors from the following reasons, and to enhance the yield. That is, since the carrier density of the two-dimensional electron gas under concave portion 404a is smaller compared with the portion other than under concave portion 404a, the sheet resistance is a high resistance. However, since it is possible to induce carriers by a gate voltage applied to gate electrode 107 in the two-dimensional electron gas immediately under gate electrode 107, it is possible to set the sheet resistance of the two-dimensional electron gas to a low resistance compared with a case where the gate electrode is not applied thereto. On the other hand, in the region other than immediately under gate electrode 107, the carrier density of the two-dimensional electron gas is determined by a structure of epitaxial growth layers (channel layer 103, barrier layer 404, diffusion suppression layer 405, and p-type conductive layer 406), and thus, cannot be adjusted. Accordingly, since the entirety of concave portion 404a is covered with gate electrode 107, it is possible to increase the carrier density of the two-dimensional electron gas under concave portion 404a, compared with a case where concave portion 404a is not entirely covered with gate electrode 107, that is, a case where a part of concave portion 404a is covered with gate electrode 107. Thus, it is possible to set the sheet resistance to the low resistance.

Further, in this exemplary embodiment, a lower part of p-type conductive layer 406 is buried in concave portion 404a, but the lower part of p-type conductive layer 406 doesn't have to be buried in concave portion 404a. That is, it is sufficient if a distance between the interface between channel layer 103 and barrier layer 404 and the interface between diffusion suppression layer 405 and p-type conductive layer 406 under gate electrode 107 can be secured so as to realize the normally-off type of nitride semiconductor device 400.

A manufacturing process of nitride semiconductor device 400 according to this exemplary embodiment is approximately the same as the manufacturing process of nitride semiconductor device 100 according to the first exemplary embodiment, and is different therefrom in that concave portion 404a is formed on the upper surface of barrier layer 404 by a dry etching after barrier layer 404 is formed and before diffusion suppression layer 405 is formed. Hence, nitride semiconductor device 400 is manufactured.

Hereinbefore, as examples of the techniques in the present disclosure, the exemplary embodiments and modification examples thereof have been described. For this purpose, the accompanying drawings and the detailed description have been provided.

Accordingly, the components disclosed in the accompanying drawings and the detailed description not only include components which are essential for solving the problems, but may also include components which are not essential for solving the problems in order to illustrate the above techniques. Thus, although these non-essential components are disclosed in the accompanying drawings and the detailed description, this does not directly intend that these non-essential components are essential.

Further, since the above-described embodiments and modification examples are examples of the techniques in the present disclosure, the present disclosure is not limited to the disclosed content. Various modifications conceivable by those skilled in the art in a range without departing from the spirit of the present disclosure with respect to the exemplary embodiments and modification examples, modes formed by combination of components in different embodiments and modification examples may also be included in scopes of one or plural aspects of the present disclosure.

For example, in the fourth exemplary embodiment, diffusion suppression layer 405 may have a structure in which a layer made of $Al_aGa_{1-a}N$ (0<a≤1) and a layer made of GaN are stacked.

According to this configuration, in a region other than concave portion 404a, the $Al_aGa_{1-a}N$ layer (0<a≤1) of diffusion suppression layer 405 in addition to barrier layer 404 remains after selective dry etching. Accordingly, when concave portion 404a is formed, by etching barrier layer 404 at a depth that exceeds a film thickness which corresponds to a boundary condition between a normally-on state and a normally-off state, and by forming diffusion suppression layer 405 to achieve the film thickness of the boundary condition between the normally-off state and the normally-on state, it is possible to increase the carrier density of the two-dimensional electron gas in the region other than concave portion 404a. Thus, it is possible to reduce the sheet resistance to the low resistance.

Further, for example, in diffusion suppression layer 405 formed by the stacked structure between the layer made of $Al_aGa_{1-a}N$ (0<a≤1) and the layer made of GaN, the layer made of $Al_aGa_{1-a}N$ (0<a≤1) may have an Si concentration which is equal to or greater than $1×10^{18}/cm^3$.

According to this configuration, since the concentration of Si which is an n-type dopant, included in diffusion suppression layer 405, is equal to or greater than $1×10^{18}/cm^3$, it is possible to obtain a low contact resistance. Further, it is possible to compensate for Mg diffused from p-type conductive layer 406. Accordingly, the change of barrier layer 404 into the p-type is not easily performed, and thus, it is possible to easily obtain the low contact resistance, and to enhance the manufacturing yield.

Further, for example, in diffusion suppression layer 405 formed by the stacked structure of the layer made of $Al_aGa_{1-a}N$ (0<a≤1) and the layer made of GaN, the layer made of GaN may have an Si concentration which is equal to or greater than $1×10^{18}/cm^3$.

According to this configuration, even when the GaN layer in diffusion suppression layer 405 cannot be completely removed in selective etching of barrier layer 404 and diffusion suppression layer 405 outside the gate electrode formation region, Si made of the GaN layer in diffusion suppression layer 405 compensates for the change into the p-type due to Mg. Thus, source electrode 108 and drain electrode 109 can easily obtain low contact resistance from diffusion suppression layer 405, to thereby make it possible to enhance the manufacturing yield.

Further, for example, in the above-described exemplary embodiments and modification examples, barrier layers 104, 113, and 404 may have an Si concentration which is equal to or greater than $1×10^{18}/cm^3$.

According to this configuration, since the concentration of Si which is an n-type dopant, included in barrier layers 104, 113, and 404 is equal to or greater than $1×10^{18}/cm^3$, the change into the n-type occurs. Thus, it is possible to reduce the contact resistance.

Further, for example, in the above-described exemplary embodiments and modification examples, p-type conductive layers 106, 114, and 406 may be formed of $Al_zGa_{1-z}N$ (0<z≤1).

According to this configuration, since a bandgap of p-type conductive layers 106, 114 and 406 is large, compared with a case where p-type conductive layers 106, 114 and 406 are formed of GaN, it is possible to greatly change the position of a Fermi level as much. In other words, it is possible to bring the Fermi level close to a valence band. Then, since the large built-in potential can be obtained, a threshold voltage of a gate becomes large, and thus, the normally-off state is easily secured. Further, it is possible to increase the carrier density of the two-dimensional electron gas corresponding to the increment of the threshold voltage of the gate in a range where the normally-off state can be maintained, and to reduce the sheet resistance. In order to increase the carrier density of the two-dimensional electron gas, the bandgap of barrier layers 104, 113 and 404 may be set to be large, or the film thickness thereof may be set to be thick.

Further, gate electrode 107 is not limited to the configuration including Ni, and may be a metallic electrode including other types of metal (for example, Ti). Further, gate electrode 107 may be a conductor made of a non-metallic material such as poly-silicon.

INDUSTRIAL APPLICABILITY

The semiconductor device according to the present disclosure is useful as a power device such as a field effect transistor, for example, used in a power source circuit or the like of a consumer product such as a television.

What is claimed is:
1. A semiconductor device comprising:
   a first semiconductor layer which is made of $In_pAl_qGa_{1-p-q}N$ (0≤p+q≤1, 0≤p, and 0≤q);
   a second semiconductor layer disposed on the first semiconductor layer, and is made of $In_rAl_sGa_{1-r-s}N$ (0≤r+s≤1, 0≤r) having a bandgap larger than that of the first semiconductor layer;
   a third semiconductor layer which is selectively disposed on the second semiconductor layer, and is made of $In_tAl_uGa_{1-t-u}N$ (0≤t+u≤1, 0≤t, and s>u);
   a fourth semiconductor layer disposed on the third semiconductor layer, and is made of $In_xAl_yGa_{1-x-y}N$ (0≤x+y≤1, 0≤x, and 0≤y) having p-type conductivity;
   a gate electrode disposed on the fourth semiconductor layer; and
   a source electrode and a drain electrode which are disposed directly on the second semiconductor layer.
2. The semiconductor device of claim 1,
   wherein the third semiconductor layer has a variation in an amount of a p-type dopant per unit length in a film thickness direction, smaller than a variation in the fourth semiconductor layer.
3. The semiconductor device of claim 1,
   wherein the second semiconductor layer includes a recessed portion formed on an upper surface thereof, and
   the third semiconductor layer is disposed to fill at least a part of the recessed portion when viewed in a stacking direction.
4. The semiconductor device of claim 3,
   wherein the third semiconductor layer is disposed to fill the recessed portion when viewed in the stacking direction.
5. The semiconductor device of claim 3,
   wherein the third semiconductor layer has a structure in which a layer made of $Al_aGa_{1-a}N$ (0<a≤1) and a layer made of GaN are stacked.
6. The semiconductor device of claim 5,
   wherein the layer made of $Al_aGa_{1-a}N$ (0<a≤1) in the third semiconductor layer has an Si concentration which is equal to or greater than $1×10^{18}/cm^3$.
7. The semiconductor device of claim 5,
   wherein the layer made of GaN in the third semiconductor layer has an Si concentration which is equal to or greater than $1×10^{18}/cm^3$.
8. The semiconductor device of claim 1,
   wherein a p-type dopant of the fourth semiconductor layer is Mg, and
   the second semiconductor layer has an Mg concentration which is equal to or smaller than $1×10^{19}/cm^3$ in a portion that is in contact with the third semiconductor layer, and
   the third semiconductor layer has an Mg concentration which is equal to or smaller than $1×10^{19}/cm^3$ in a portion that is in contact with the second semiconductor layer.
9. The semiconductor device of claim 1,
   wherein the third semiconductor layer is made of GaN.

10. The semiconductor device of claim 1, wherein the third semiconductor layer has an Si concentration which is equal to or greater than $1 \times 10^{18}/cm^3$.

11. The semiconductor device of claim 1, wherein the second semiconductor layer has an Si concentration which is equal to or greater than $1 \times 10^{18}/cm^3$.

12. The semiconductor device of claim 1, wherein the second semiconductor layer is formed by layering a layer not doped with Si and disposed on a side being in contact with the first semiconductor layer and a layer having an Si concentration equal to or greater than $1 \times 10^{18}/cm^3$ and disposed on a side being in contact with the source electrode and the drain electrode.

13. The semiconductor device of claim 1, wherein the fourth semiconductor layer is made of GaN.

14. The semiconductor device of claim 1, wherein the fourth semiconductor layer is made of $Al_zGa_{1-z}N$ ($0<z\leq1$).

15. The semiconductor device of claim 1, wherein the fourth semiconductor layer has a structure in which a layer made of $Al_zGa_{1-z}N$ ($0<z\leq1$) and disposed on a side being in contact with the third semiconductor layer and a layer made of GaN and disposed on a side being in contact with a gate electrode are stacked together.

16. The semiconductor device of claim 1, further comprising a substrate on which the first semiconductor layer is disposed.

17. A method for manufacturing a semiconductor device, comprising the steps of:
forming a first semiconductor layer made of $In_pAl_qGa_{1-p-q}N$ ($0\leq p+q\leq1$, $0\leq p$, and $0\leq q$);
forming a second semiconductor layer made of $In_rAl_sGa_{1-r-s}N$ ($0\leq r+s\leq1$, $0\leq r$) having a bandgap larger than that of the first semiconductor layer, on the first semiconductor layer;
forming a third semiconductor layer made of $In_tAl_uGa_{1-t-u}N$ ($0\leq t+u\leq1$, $0\leq t$, and $s>u$) on the second semiconductor layer;
forming a fourth semiconductor layer made of $In_xAl_yGa_{1-x-y}N$ ($0\leq x+y\leq1$, $0\leq x$, and $0\leq y$) having p-type conductivity on the third semiconductor layer;
forming a gate electrode on the fourth semiconductor layer;
removing a region other than a region corresponding to the gate electrode, from the third semiconductor layer and the fourth semiconductor layer, after forming the fourth semiconductor layer; and
forming a source electrode and a drain electrode directly on the second semiconductor layer.

18. The method for manufacturing a semiconductor device of claim 17, further comprising the step of forming a substrate on which the first semiconductor layer is disposed.

* * * * *